(12) United States Patent
Sumita et al.

(10) Patent No.: US 8,461,577 B2
(45) Date of Patent: Jun. 11, 2013

(54) ORGANIC EL DEVICE

(75) Inventors: Shiro Sumita, Kanazawa (JP); Shuhei Yokoyama, Ishikawa-gun (JP); Masuyuki Oota, Hakusan (JP)

(73) Assignee: Japan Display Central Inc., Fukaya-shi (JP)

( * ) Notice: Subject to any disclaimer, the term of this patent is extended or adjusted under 35 U.S.C. 154(b) by 184 days.

(21) Appl. No.: 13/025,455

(22) Filed: Feb. 11, 2011

(65) Prior Publication Data

US 2011/0198630 A1 Aug. 18, 2011

(30) Foreign Application Priority Data

Feb. 16, 2010 (JP) ................................. 2010-031829
Jan. 25, 2011 (JP) ................................. 2011-013056

(51) Int. Cl.
*H01L 29/08* (2006.01)
(52) U.S. Cl.
USPC .. 257/40; 257/69; 257/E51.019; 257/E51.02; 257/E51.022
(58) Field of Classification Search
USPC ....................... 257/40, 89, E51.019, E51.022
See application file for complete search history.

(56) References Cited

U.S. PATENT DOCUMENTS

| | | | |
|---|---|---|---|
| 6,459,199 | B1 | 10/2002 | Kido et al. |
| 6,853,133 | B2 | 2/2005 | Liao et al. |
| 2003/0232563 | A1 | 12/2003 | Kamiyama et al. |
| 2005/0249972 | A1 | 11/2005 | Hatwar et al. |
| 2008/0238297 | A1 | 10/2008 | Oota |
| 2009/0108741 | A1 | 4/2009 | Yokoyama et al. |
| 2009/0243466 | A1 | 10/2009 | Yokoyama et al. |
| 2010/0078629 | A1 | 4/2010 | Yokoyama et al. |
| 2010/0176412 | A1 | 7/2010 | Yokoyama et al. |

FOREIGN PATENT DOCUMENTS

| | | |
|---|---|---|
| JP | 2002-208491 A | 7/2002 |
| JP | 2003-157973 | 5/2003 |
| JP | 2005-164818 A | 6/2005 |
| JP | 2005-166315 A | 6/2005 |
| JP | 2006-92936 | 4/2006 |
| JP | 3849066 | 9/2006 |
| JP | 2006-324016 | 11/2006 |
| JP | 2007-108248 | 4/2007 |
| JP | 2007-299729 | 11/2007 |
| JP | 2009-54371 A | 3/2009 |
| JP | 2009-111023 | 5/2009 |
| JP | 2009-245870 | 10/2009 |
| JP | 2009-535779 | 10/2009 |
| JP | 2009-266673 | 11/2009 |
| JP | 2010-80738 | 4/2010 |
| JP | 2010-165793 | 7/2010 |
| KR | 2000-0011034 | 2/2000 |
| KR | 10-2007-0108075 | 11/2007 |
| WO | WO 97/43874 | 11/1997 |
| WO | WO 2007/129834 A1 | 11/2007 |

OTHER PUBLICATIONS

Japanese Office Action issued Jun. 26, 2012 in Patent Application No. 2011-013056 with English Translation.

*Primary Examiner* — Minchul Yang
(74) *Attorney, Agent, or Firm* — Oblon, Spivak, McClelland, Maier & Neustadt, L.L.P.

(57) ABSTRACT

According to one embodiment, an organic EL device includes an insulating substrate, first and second interlayer insulators, pixel electrodes, an organic layer, and a counter electrode. The first interlayer insulator is positioned above the insulating substrate. The second interlayer insulator is positioned on the first interlayer insulator and provided with slits. The pixel electrodes are arranged on the second interlayer insulator. Two or more of the pixels are adjacent to each other with one of regions corresponding to the slits interposed therebetween. The organic layer is positioned on the pixel electrodes and includes an emitting layer. The counter electrode is positioned above the organic layer.

4 Claims, 16 Drawing Sheets

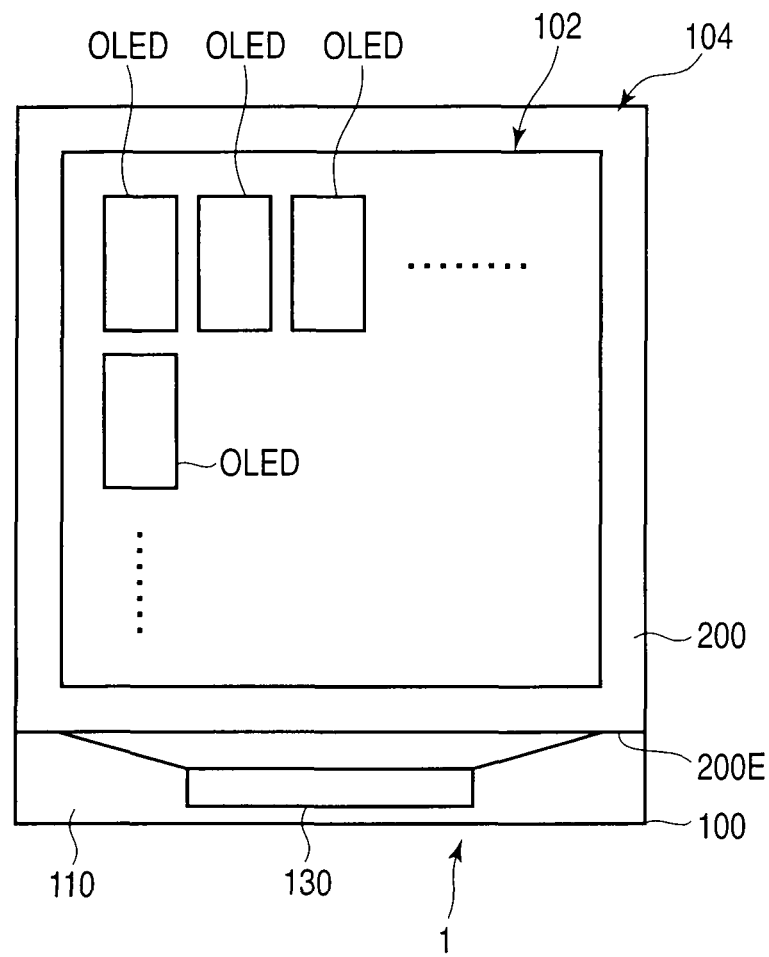
F I G. 1

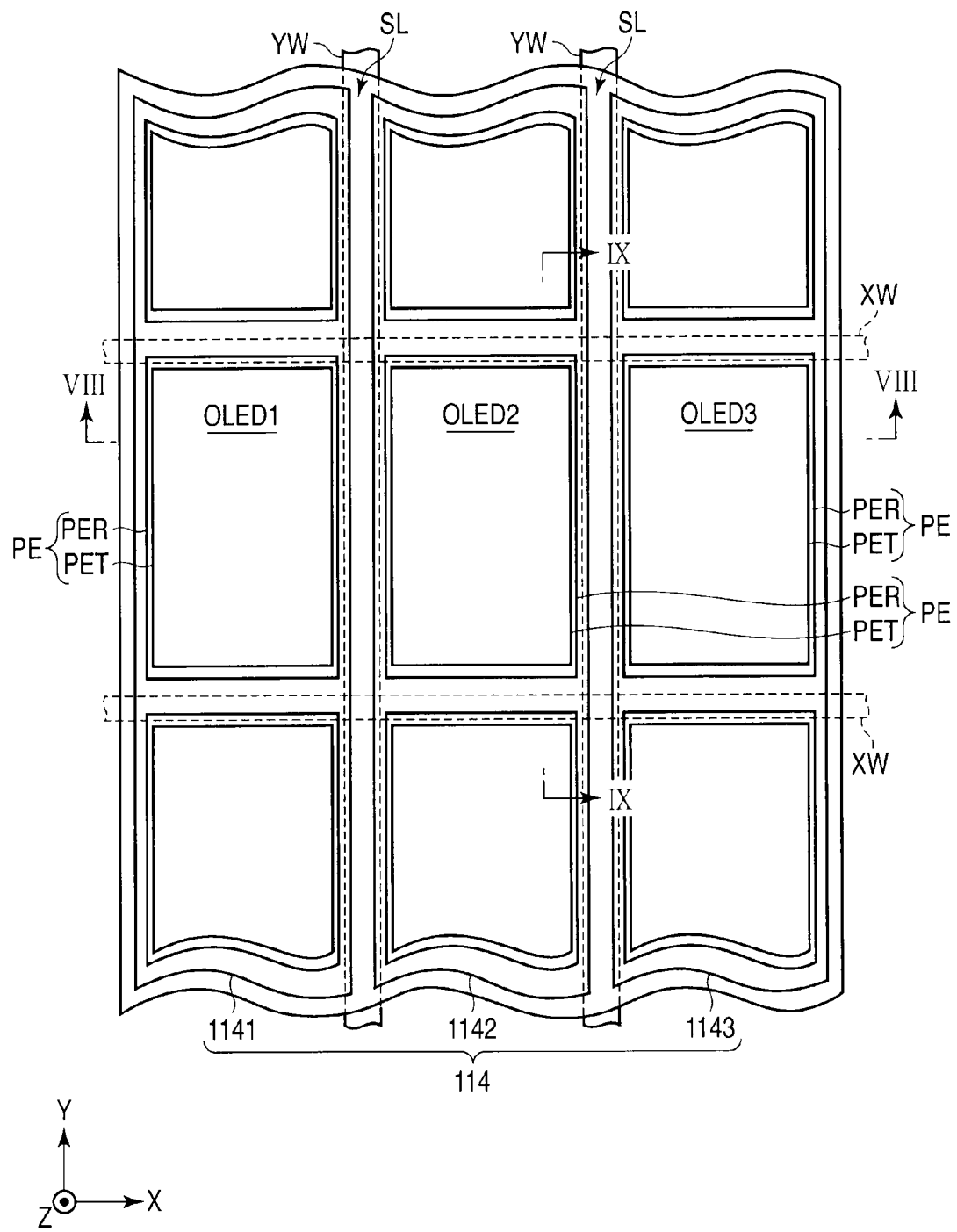
F I G. 7

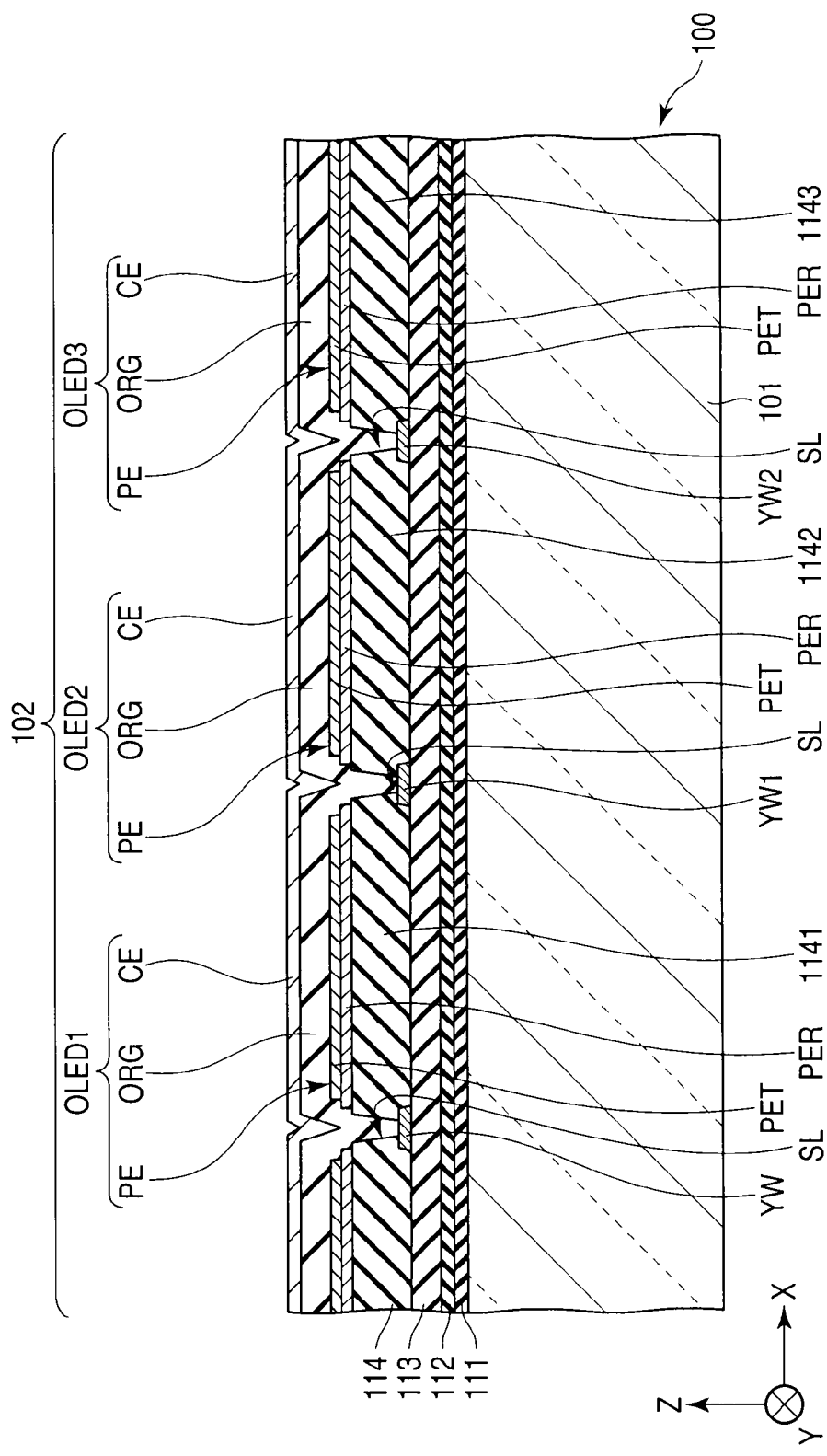
F I G. 8

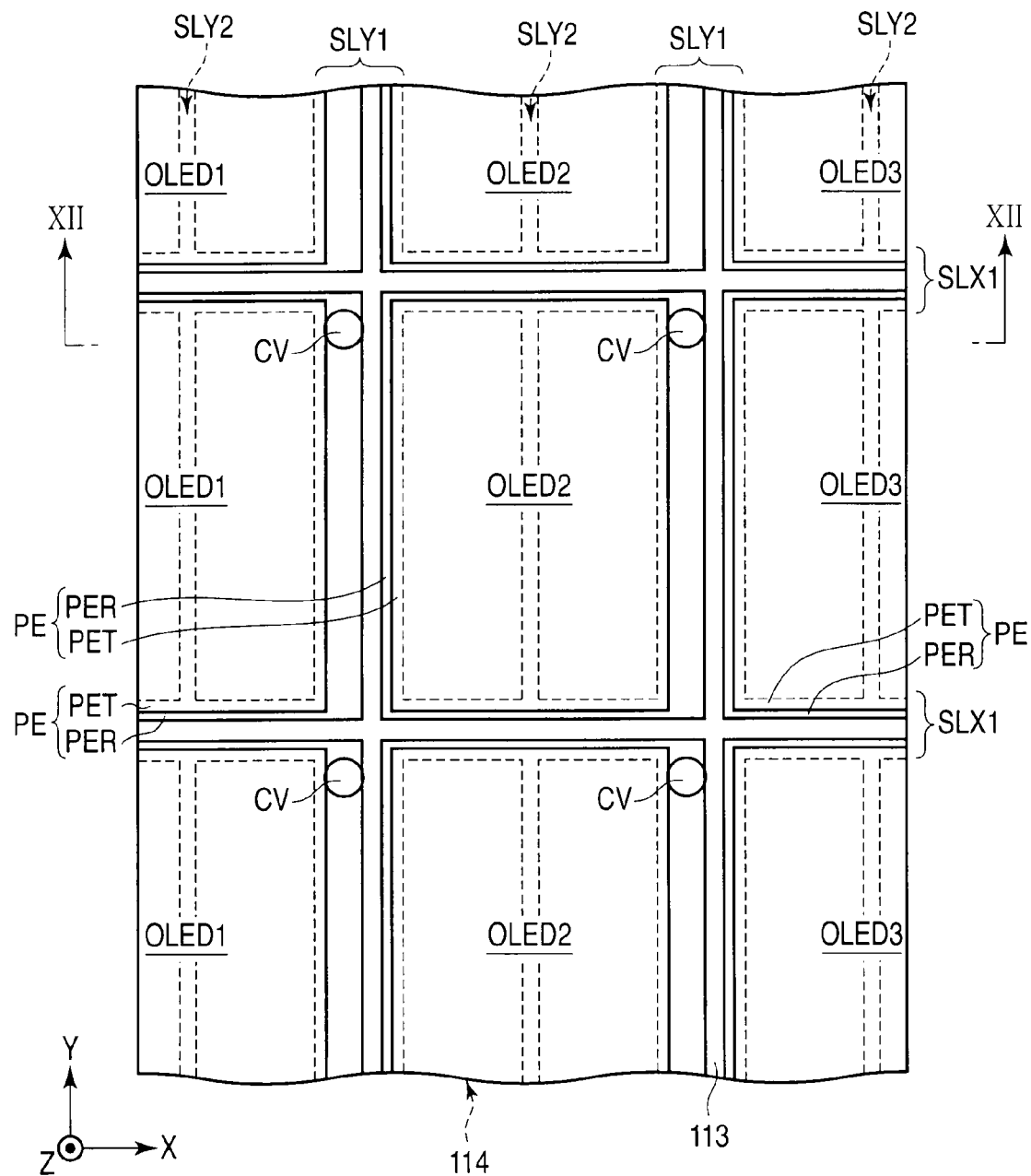
F I G. 10

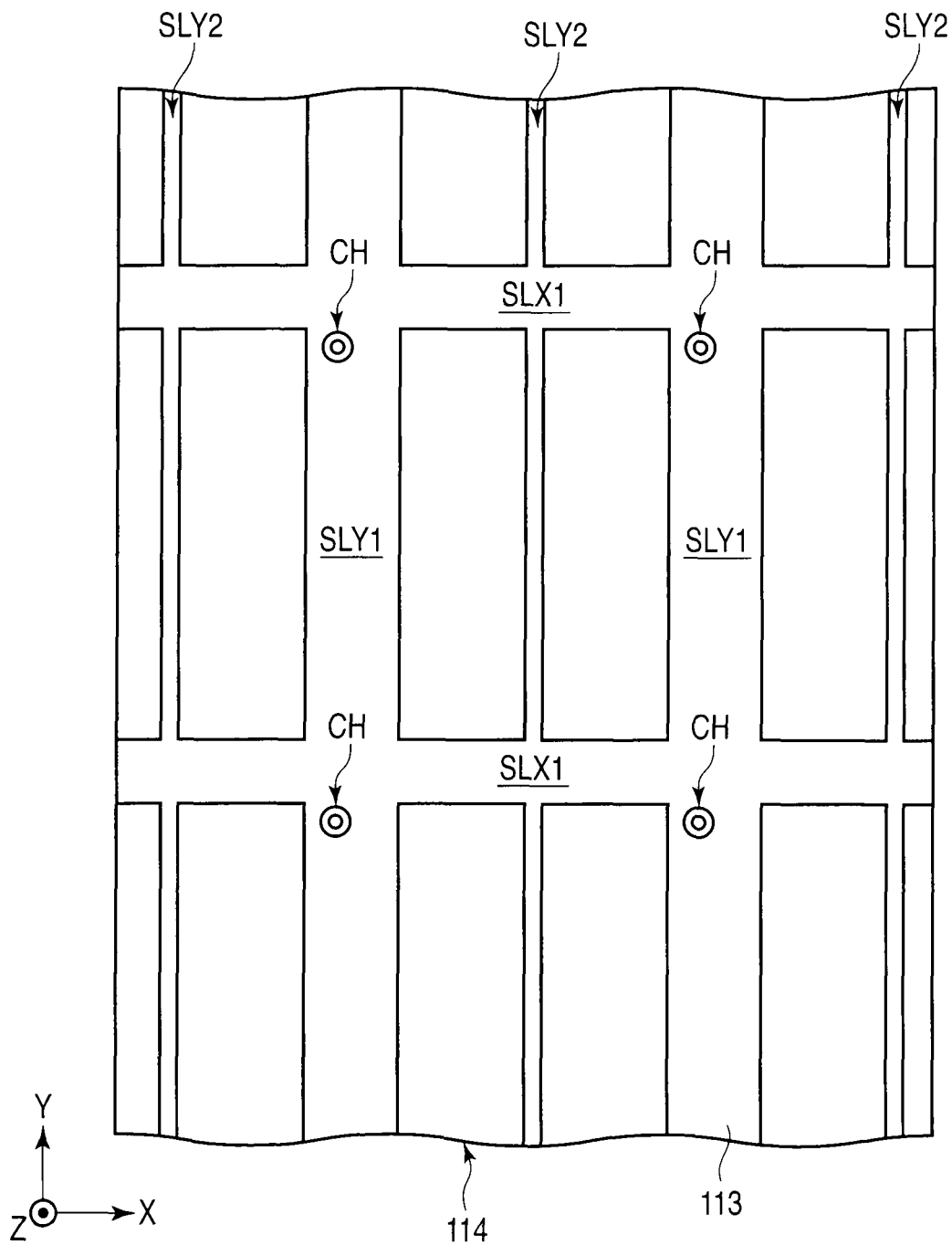
F I G. 11

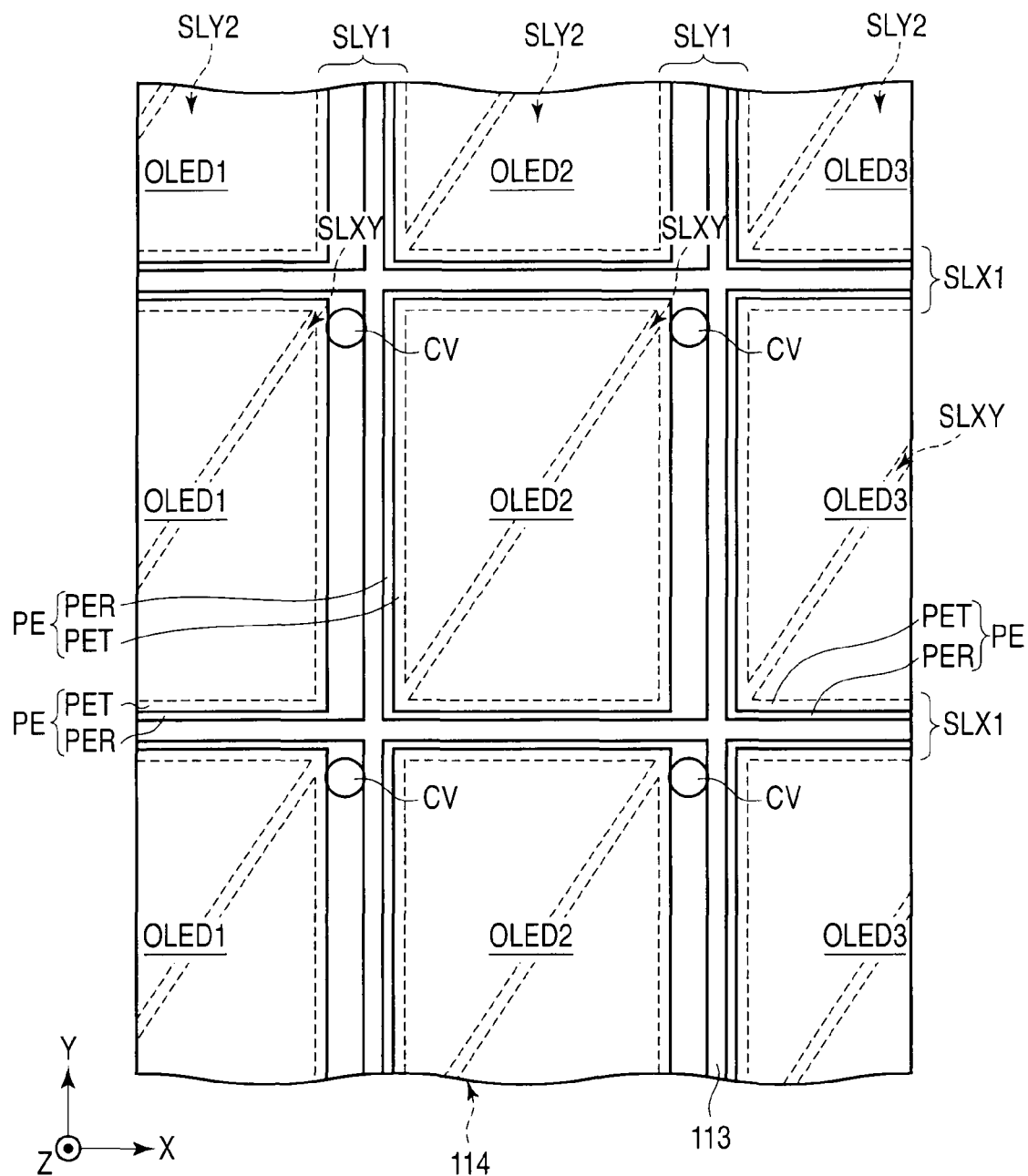
F I G. 13

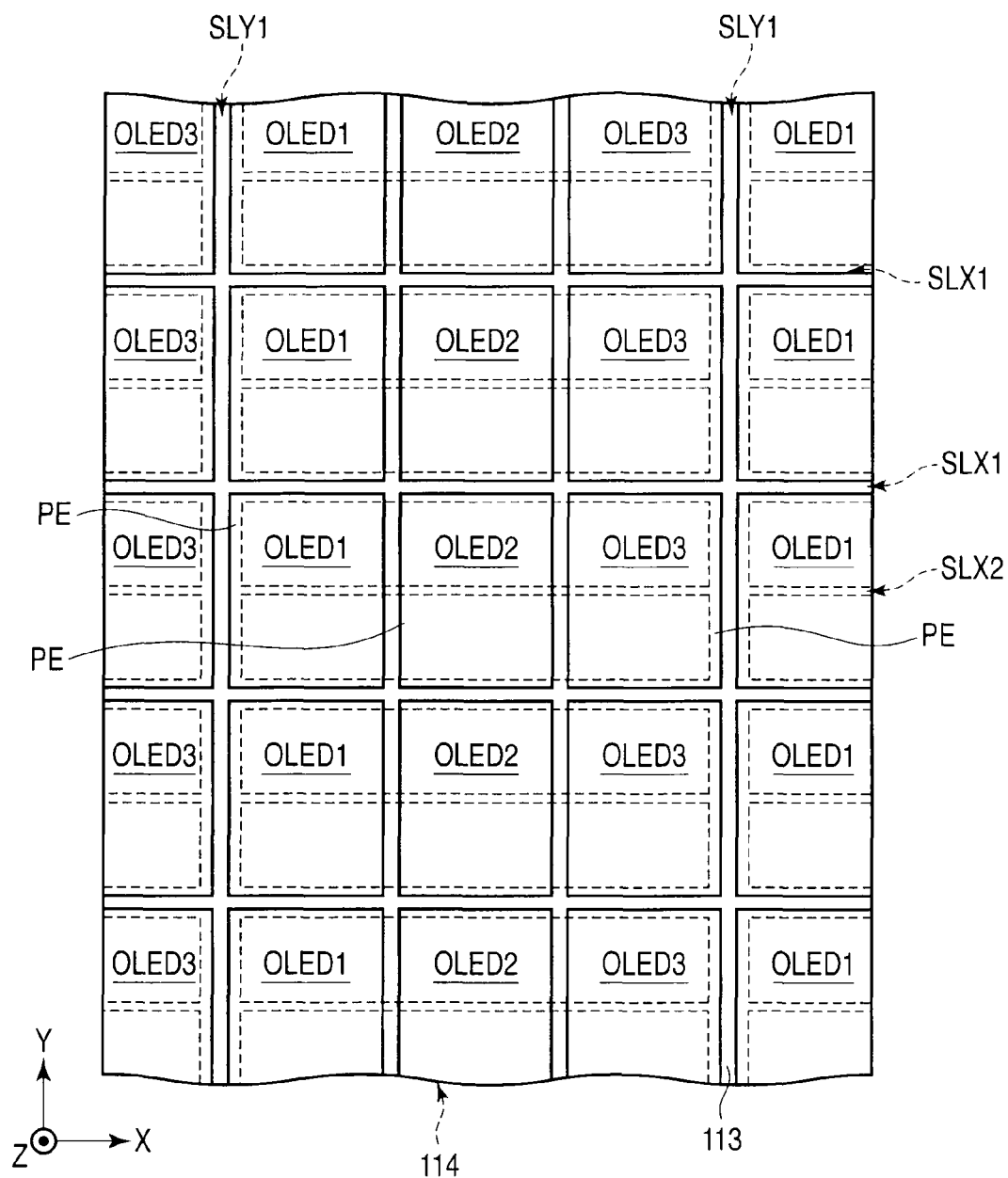
F I G. 15

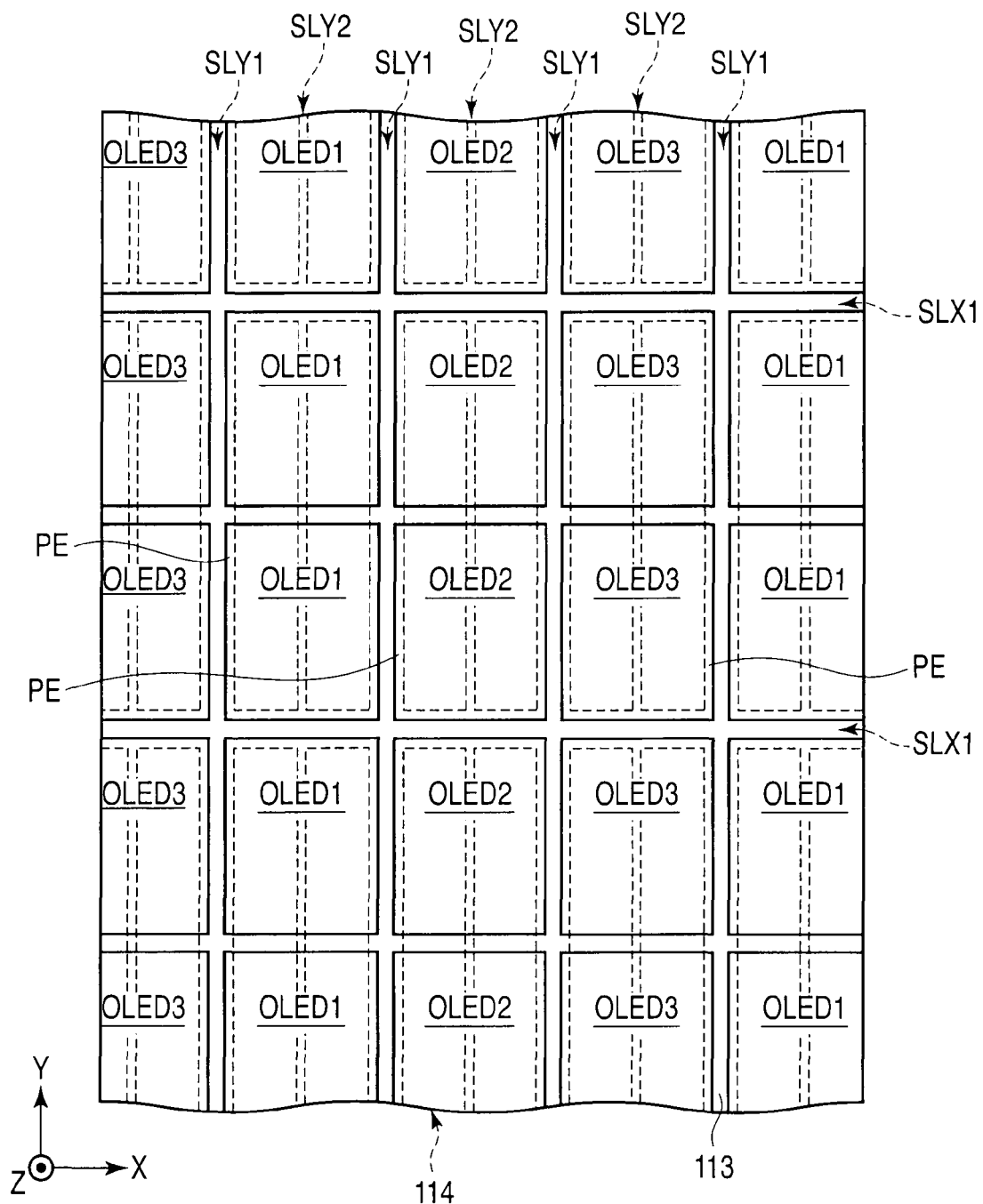
F I G. 16

ORGANIC EL DEVICE

CROSS-REFERENCE TO RELATED APPLICATIONS

This application is based upon and claims the benefit of priority from Japanese Patent Applications No. 2010-031829, filed Feb. 16, 2010; and No. 2011-013056, filed Jan. 25, 2011; the entire contents of both of which are incorporated herein by reference.

FIELD

Embodiments described herein relate generally to an organic electroluminescence (hereinafter, referred to as EL) device.

BACKGROUND

In recent years, displays including organic EL elements as display elements have been actively studied. An organic EL element is a light-emitting element, and thus such a display does not require a backlight. Therefore, organic EL displays can be thinner and lighter as compared with liquid crystal displays. Organic EL displays are also more advantageous in achieving a higher response speed, wider viewing angle, and higher contrast as compared with liquid crystal displays.

An organic EL display enabling full-color display includes, for example, pixels emitting red, green and blue light. In production of such a display, emitting layers having different emission spectra are formed in patterns that correspond to arrangements of pixels emitting red, green, and blue light. For example, an emitting layer that emits red light is formed by vacuum evaporation using a fine mask that is provided with through-holes correspondingly with the pixels emitting red light. Then, emitting layers emitting green and blue light are formed in this order by repetition of the same processes.

BRIEF DESCRIPTION OF THE DRAWINGS

FIG. 1 is a sectional view schematically showing an organic EL display according to the first embodiment;

FIG. 7 is a plan view schematically showing an array substrate included in a display panel of an organic EL display according to the second embodiment;

FIG. 8 is a sectional view taken along a line VIII-VIII of the array substrate shown in FIG. 7;

FIG. 10 is a plan view schematically showing an array substrate included in a display panel of an organic EL display according to the third embodiment;

FIG. 11 is a plan view schematically showing slits provided to the second interlayer insulator of the array substrate shown in FIG. 10;

FIG. 13 is a plan view schematically showing an array substrate included in a display panel of an organic EL display according to the fourth embodiment;

FIG. 15 is a plan view schematically showing an array substrate included in a display panel of an organic EL display according to the sixth embodiment; and FIG. 16 is a plan view schematically showing an array substrate included in a display panel of an organic EL display according to the seventh embodiment.

DETAILED DESCRIPTION

Figure 2:
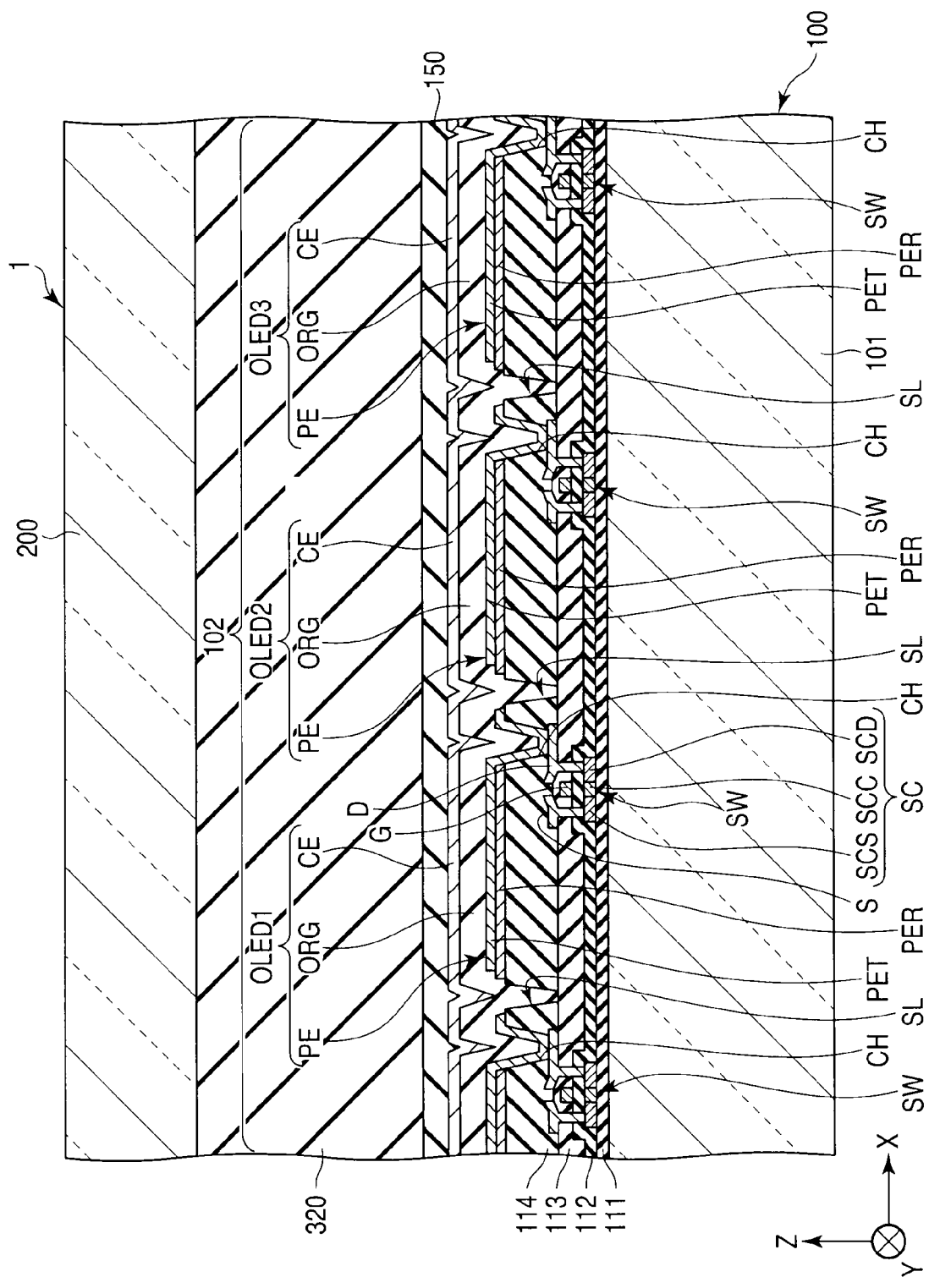
FIG. 2 is a sectional view schematically showing the display panel of the organic EL display shown in FIG. 1.

In general, according to one embodiment, there is provided an organic EL device comprising an insulating substrate, first and second interlayer insulators, pixel electrodes, an organic layer, and a counter electrode. The first interlayer insulator is positioned above the insulating substrate. The second interlayer insulator is positioned on the first interlayer insulator and provided with slits. The pixel electrodes are arranged on the second interlayer insulator. Two or more of the pixels are adjacent to each other with one of regions corresponding to the slits interposed therebetween. The organic layer is positioned on the pixel electrodes and includes an emitting layer. The counter electrode is positioned above the organic layer.

Examples of organic EL devices that are applied to organic EL displays will be described below with reference to the drawings. In the drawings, the same reference characters denote components having the same or similar functions and duplicates descriptions will be omitted. In the drawings, the X and Y direction are parallel to the display surface and intersect with each other. For example, the X and Y directions are orthogonal to each other. The Z direction is a direction that is perpendicular to the display surface.

The first embodiment relates to an organic EL display that employs an active matrix driving method. The organic EL display according to the first embodiment is explained below with reference to FIGS. 1 to 6.

The organic EL display according to the first embodiment includes a display panel 1 having a nearly rectangular shape as shown in FIG. 1.

The display panel 1 includes an array substrate 100 and a counter substrate 200. The array substrate 100 and the counter substrate 200 face each other with a sealing layer having a frame-like shape (not shown) interposed therebetween.

The array substrate 100 includes an active area 102 for displaying an image having a nearly rectangular shape and a frame-like peripheral area 104 surrounding the active area 102. In the active area 102, organic EL elements OLED are arranged in a matrix form. The peripheral area 104 includes an extension portion 110 protruding outwardly from an edge 200E of the counter substrate 200. A connection section is provided to the extension portion 110. A power source or signal supply source such as driver integrated circuit chip and flexible printed circuit can be mounted on the connection section.

The counter substrate 200 faces the organic EL elements OLED. The counter substrate 200 is, for example, an insulating substrate having a light-transmitting property such as glass substrate and plastic substrate.

The display panel 1 is a top emission type that emits light from a side of a counter substrate 200. The display panel 1 may be a bottom emission type that emits light from a side of an array substrate 100.

As shown in FIG. 2, the array substrate 100 includes, for example, an insulating substrate 101 having a light-transmitting property such as glass substrate and plastic substrate. The switching elements SW and the organic EL elements OLED1 to OLED3 are arranged in the active area 102 above the insulating substrate 101.

An undercoat layer 111 as an insulating layer is formed on the insulating substrate 101. The undercoat layer 111 extends over almost the entire active area 102. The undercoat layer 111 is made of, for example, an inorganic compound such as silicon oxide and silicon nitride.

On the undercoat layer 111, semiconductor layers SC of the switching elements SW are arranged. These semiconductor layers SC are made of, for example, polysilicon. In each of the semiconductor layers, a source region SCS and a drain region SCD are formed with a channel region SCC sandwiched therebetween.

The semiconductor layers SC and the undercoat layer 111 are covered by a gate insulator 112. The gate insulator 112 extends over almost the entire active area 102. The gate insulator 112 is made of, for example, an inorganic compound such as silicon oxide and silicon nitride.

On the gate insulator 112, gate electrodes G of the switching elements SW are arranged at positions of the channel regions SCC. In this example, the switching elements SW are top-gate type p-channel thin-film transistors (TFTs).

A first interlayer insulator 113 covers the gate electrodes G and the gate insulator 112. The first interlayer insulator 113 extends over almost the entire active area 102. The first interlayer insulator 113 is made of, for example, an inorganic compound such as silicon dioxide and silicone nitride.

On the first interlayer insulator 113, source electrodes S and drain electrodes D of the switching elements SW are arranged. The source electrodes S are in contact with the source regions SCS of the semiconductor layers SC. The drain electrodes D are in contact with the drain regions SCD of the semiconductor layers SC.

The gate electrodes G, source electrodes S and drain electrodes D of the switching elements SW are made of, for example, conductive materials such as molybdenum (Mo), tungsten (W), aluminum (Al) and titanium (Ti). The gate electrodes G, source electrodes S and drain electrodes D may have a multilayer structure including electrically conductive layers.

A second interlayer insulator 114 covers the source electrodes S, the drain electrodes D and the first interlayer insulator 113. The second interlayer insulator 114 extends over almost the entire active area 102. The second interlayer insulator 114 is made from, for example, an organic material such as ultraviolet-curing resin and thermosetting resin. As the material of the second interlayer insulator 114, an inorganic compound such as silicon nitride may be used.

Contact holes CH are formed in the second interlayer insulator 114 at positions of the switching elements SW. Specifically, each contact hole CH communicates with a part of the drain electrode D.

Slits SL extending in the Y direction are also formed in the second interlayer insulator 114. In the case where ultraviolet-curing resin is used as the raw material of the second interlayer insulator 114, the second interlayer insulator 114 having the contact holes CH and the slits SL can be formed by irradiating a layer of the ultraviolet-curing resin with light in a predetermined pattern and then subjecting the layer to a developing process.

Typically, the slits SL extend over the length of the active area 102. Although the slits SL may be provided only in the active area 102, it is desirable that they further extend in the peripheral area 104. Details of the slits SL will be described later.

The organic EL elements OLED1 to OLED3 are arranged on the second interlayer insulator 114. Each of the organic EL elements OLED1 to OLED3 includes a pixel electrode PE, an organic layer ORG and a counter electrode CE.

The pixel electrodes PE are arranged on the second interlayer insulator 114. Each of the pixel electrodes PE includes an electrode body and a contact portion that extends in the contact hole CH and electrically connects the electrode body and the drain electrode D. The pixel electrodes PE are, for example, anodes. The pixel electrodes PE are spaced apart from each other.

The pixel electrodes PE can have various structures. In the present example, each pixel electrode PE has a two-layer structure including a reflecting layer PER and a transmitting layer PET. The reflecting layers PER are arranged on the interlayer insulator 114. The transmitting layers PET are arranged on the reflecting layers PER, respectively. The reflecting layers PER are made of, for example, a conductive material having a light-reflecting property such as silver (Ag) and aluminum (Al). The transmitting layers PET are made of, for example, a conductive material having a light-transmitting property such as indium tin oxide (ITO) and indium zinc oxide (IZO).

The pixel electrodes PE may be reflecting layers or transmitting layers having a single layer structure. Alternatively, the pixel electrodes PE may have a multilayer structure including three or more layers. When the display panel 1 is a top emission type, the pixel electrode PE includes at least the reflecting layer PER. When the display panel 1 is a bottom emission type, the pixel electrode does not include the reflecting layer PER.

The organic layer ORG is provided on the pixel electrodes PE. The organic layer ORG is a continuous film that extends over almost the entire active area 102. That is, the organic layer ORG includes first regions covering the pixel electrodes PE and second regions positioned in the slits SL.

The organic layer ORG includes an emitting layer. Typically, the emitting layer is a continuous film that extends over almost the entire active area 102. Such an emitting layer includes regions positioned above the pixel electrodes PE and regions positioned in the slits SL.

The organic layer ORG may further include one or more layers such as hole injection layer, hole-transporting layer, electron injection layer, and electron-transporting layer. The material of the emitting layer may be a fluorescent material or phosphorescent material. In the organic layer ORG, when one or more layers include an organic compound or organometallic compound, the other layers may or may not include an organic compound or organometallic compound.

The counter electrode CE is provided on the organic layer ORG. In this example, the counter electrode CE corresponds to a cathode. The counter electrode CE is a continuous film that extends over almost the entire active area 102.

The counter electrode CE is, for example, a semitransparent layer. The semitransparent layer is made of, for example, conductive materials such as magnesium (Mg) and silver (Ag). The counter electrode CE may have a two-layer structure of a semitransparent layer and transmitting layer or a single layer structure of a transmitting layer or semitransparent layer. The transmitting layer is made of, for example, a conductive material having a light-transmitting property such as ITO and IZO. When the display panel 1 is bottom emission type, the counter electrode CE includes a reflecting layer or semitransparent layer.

A protective layer 150 covers the counter electrode CE. The protective layer 150 is a continuous layer that extends over almost the entire active area 102. Thus, the protective layer 150 covers the organic EL elements OLED1 to OLED3. The protective layer 150 is made of a material having a light-transmitting property and impermeability to moisture, for example, an inorganic compound such as silicon nitride and silicon oxynitride. In the case where the display panel 1 is a top emission type, it is desirable that the material of the protective layer 150 has a high transmittance for the light that the organic EL elements OLED1 to OLED3 emit. The protective layer 150 plays a role of a moisture barrier layer that prevents moisture from permeating into the organic EL elements OLED1 to OLED3.

The counter substrate 200 is positioned above the organic EL elements OLED1 to OLED3. The counter substrate 200 is, for example, an insulating substrate having a light-transmitting property such as glass substrate and plastic substrate.

In this example, the space between the array substrate 100 and the counter substrate 200 is filled with a filler layer 320. The filler layer 320 is made from, for example, an organic material having a light-transmitting property such as thermosetting resin and ultraviolet-curing resin. The filler layer 320 may be omitted.

In this display panel 1, the emitting layer of the organic layer ORG is a continuous layer that extends over the organic EL elements OLED1 to OLED3. However, luminous colors of the organic EL elements OLED1 to OLED3 differ from one another. In this example, the luminous color of the organic EL element OLED1, that of the organic EL element OLED2, and that of the organic EL element OLED3 are red, green, and blue, respectively.

Here, the wavelength range of 595 nm to 800 nm is defined as the first wavelength range, and a color of light having a main wavelength within the first wavelength range is referred to as red. The range of wavelengths that is longer than 490 nm and shorter than 595 nm is defined as the second wavelength range, and a color of light having a main wavelength within the second wavelength range is referred to as green. The wavelength range of 400 nm to 490 nm is defined as the third wavelength range, and a color of light having a main wavelength within the third wavelength range is referred to as blue.

An example of a structure that can be employed in the organic layer ORG will be described below with reference to FIG. 3.

Figure 3:
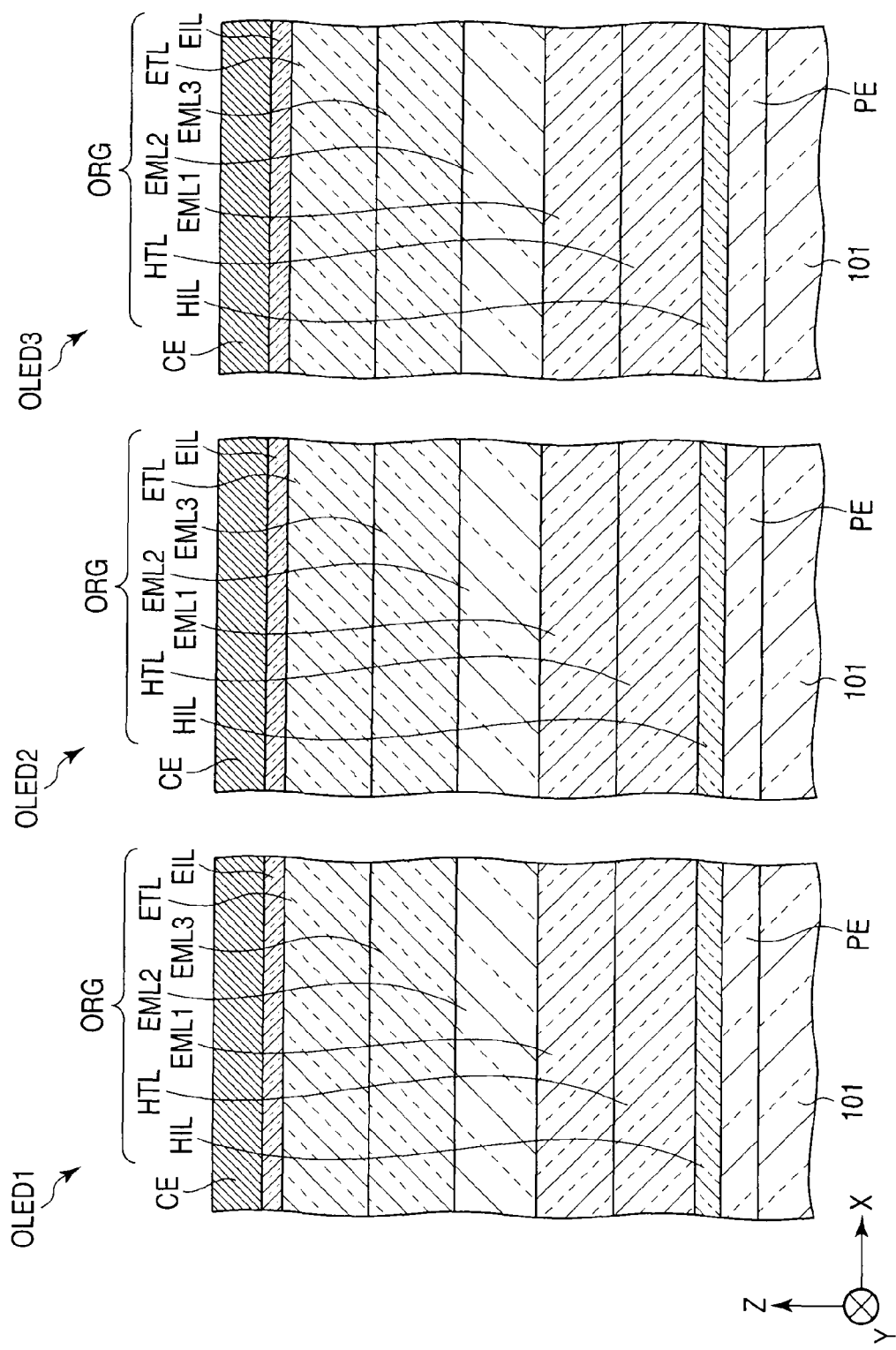
FIG. 3 is a sectional view schematically showing an example of a structure that can be employed in the organic EL elements included in the display panel of FIG. 2.

The organic layer ORG shown in FIG. 3 includes a hole injection layer HIL, a hole-transporting layer HTL, a first emitting layer EML1, a second emitting layer EML2, a third emitting layer EML3, an electron-transporting layer ETL, and an electron injection layer EIL. One or more of the hole injection layer HIL, hole-transporting layer HTL, electron-transporting ETL, and electron injection layer EIL can be omitted. Each of the layers included in the organic layer ORG is a continuous film that extends over the organic EL elements OLED1 to OLED3.

The emitting layer EML1 includes a first dopant whose luminous color is red. The emitting layer EML2 includes a second dopant whose luminous color is green. The emitting layer EML3 includes a third dopant whose luminous color is blue. Typically, each of the emitting layers EML1 to EML3 further includes a host material. Host materials of the emitting layers EML1 to EML3 may or may not be the same.

Portions of the emitting layer EML1 that are used for the organic EL elements OLED2 and OLED3 have been subjected to a quenching treatment. Further, portions of the emitting layer EML2 that are used for the organic EL element OLED3 have been subjected to a quenching treatment. The "quenching treatment" means a treatment that reduces emission efficiency or a treatment that shifts a main wavelength of a luminous color to a longer wavelength. The quenching treatment includes, for example, irradiation with light such as ultraviolet ray.

In the first organic EL element OLED1, a red color is displayed by emission of the first dopant. In the second organic EL element OLED2, the first dopant is quenched and a green color is displayed by emission of the second dopant. In the third organic EL element OLED3, the first and second dopants are quenched and a blue color is displayed by emission of the third dopant.

The emitting layer may not have a three-layer structure. For example, the emitting layer may have a two-layer structure including the first and second emitting layers or a single layer structure having only the first emitting layer. In the case of the two-layer structure, the first emitting layer may include at least one of the second and third dopants in addition to the first dopant, and the second emitting layer may include at least one of the first and third dopants in addition to the second dopant. In the case of the single layer structure, the first emitting layer may include the first to third dopants.

As the first to third dopants, those that change light-emitting performance by light irradiation are used. For example, as the first to third dopants, those that reduce the light-emitting performance by light irradiation are used. Alternatively, as the first to third dopants, those that change luminous colors by light irradiation may be used.

As such dopants, for example, those that change conformation by light irradiation can be used. For example, a dopant that isomerizes by light irradiation can be used. As an example of isomerization, isomerization between cis-isomer and trans-isomer will be briefly described below. A cis form is a conformation of a molecule that has two side residues or atomic groups being on the same side with respect to the main structure such as double bond and planar ring(s). A trans form is a conformation of a molecule that has two side residues or atomic groups being on opposite sides with respect to the main structure. For example, a dopant that isomerizes from a cis form to a trans form by irradiation with light such as ultraviolet light changes the light-emitting performance when irradiated with light. Similarly, a dopant that isomerizes from a trans form to a cis form changes its light-emitting performance when irradiated with light. Such materials are, for example, photochromic materials.

Dopants causing photoisomerization are, for example, those referred to as photoconvertible proteins or fluorescent proteins. For example, the fluorescent proteins include those that are activated by ultraviolet irradiation and then change from a quenching state to a state in which light can be emitted, and those that vary an emission wavelength by ultraviolet irradiation. Such materials can be used as the above-mentioned dopant.

Alternatively, a material that forms a chemical bond with an additive or host material included in the emitting layer to change the light-emission performance can be used as the dopant.

The display panel 1 shown in FIG. 2 employs a structure in which a partition for separating the organic EL elements OLED1 to OLED3 from one another is omitted. For this reason, each of the pixel electrodes PE is completely in contact with the organic layer ORG. In addition, the organic layer ORG is a continuous layer that extends over the organic EL elements OLED1 to OLED3. That is, the organic layer ORG includes the first regions covering the pixel electrodes and the second regions positioned in the slits SL.

Next, arrangement of the wirings included in the array substrate 100, the second interlayer insulator 114 and the organic EL elements OLED1 to OLED3 will be described.

Figure 4:
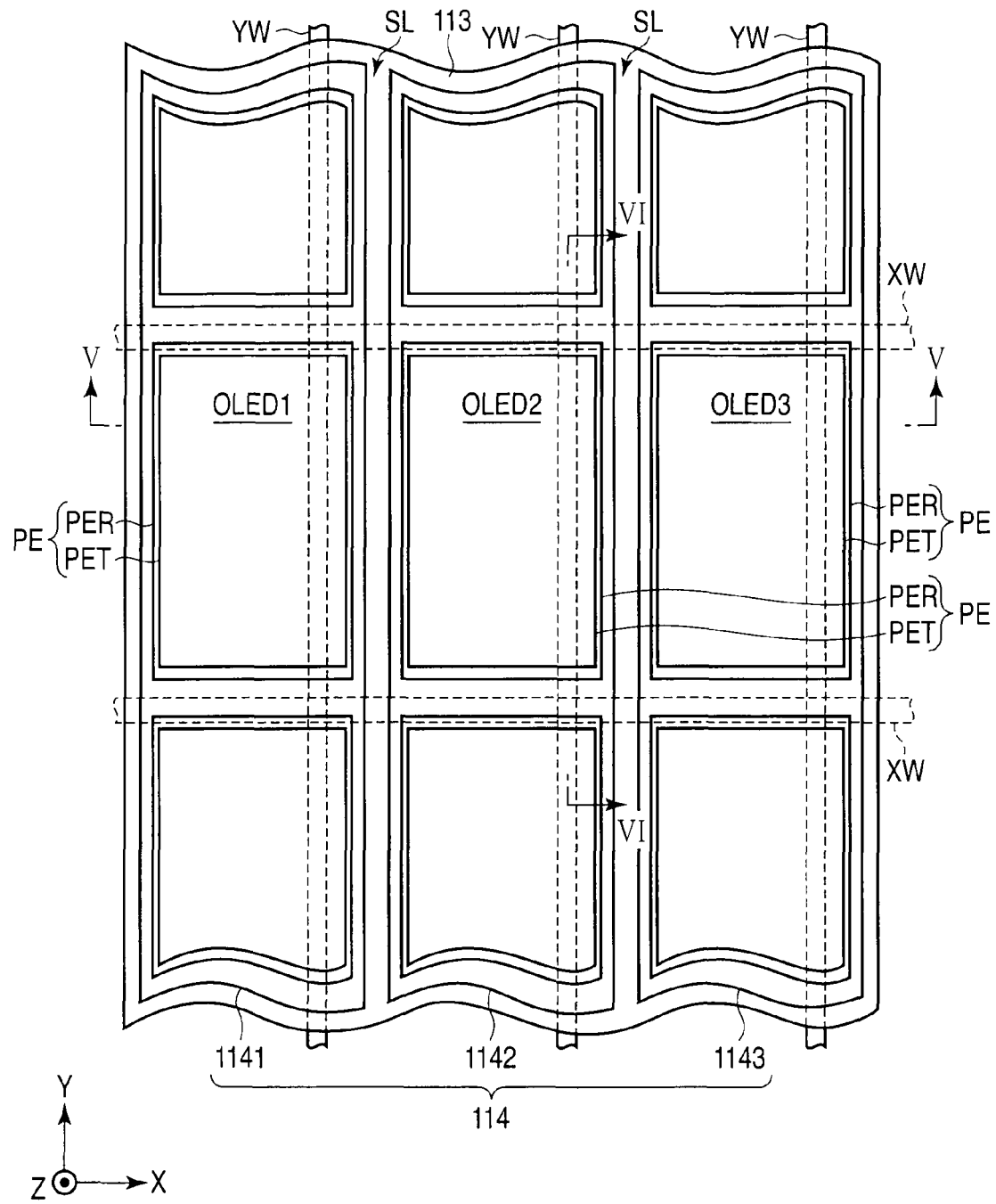
FIG. 4 is a plan view schematically showing the array substrate included in the display panel shown in FIG. 2.

FIG. 4 is a plan view schematically showing the array substrate included in the display panel shown in FIG. 2. In FIG. 4, the switching elements SW, the organic layer ORG, the counter electrode CE, etc. are not shown.

Below the organic EL elements OLED1 to OLED3, first lines XW each extending in the X direction are arranged in the Y direction. Between the wiring layer of the first lines XW and the organic EL elements OLED1 to OLED3, second lines YW each extending in the Y direction are arranged in the X direction.

The first lines XW are, for example, gate lines that are connected to the gates G of the switching elements SW. The first interlayer insulator 113 covers the lines XW.

The second lines YW are, for example, source lines that are connected to the source electrodes S of the switching elements SW. The lines YW are arranged on the first interlayer insulator 113.

The second interlayer insulator 114 is formed above the wiring layer of the lines YW. The second interlayer insulator 114 is provided with the slits SL, which are arranged in a stripe pattern. Specifically, the second interlayer insulator 114 is provided with the slits SL each extending in the Y direction and arranged in the X direction. In other words, the second interlayer insulator 114 includes insulating layers each extending in the Y direction and arranged in the X direction. In FIG. 4, as parts of such insulating layers, a first insulating layer 1141, a second insulating layer 1142 and a third insulating layer 1143 are shown.

Each of the insulating layers 1141 to 1143 extends in the Y direction. The insulating layers 1141 and 1142 are spaced apart from each other with one of the slits SL interposed therebetween. The insulating layers 1142 and 1143 are spaced apart from each other with another one of the slits SL interposed therebetween. In the active area 102, the insulating layers 1141 to 1143 are arranged in a form of a stripe pattern.

The pixel electrodes PE of the first organic EL elements OLED1 are formed on the first insulating layer 1141. The pixel electrodes PE of the second organic EL elements OLED2 are formed on the second insulating layer 1142. The pixel electrodes PE of the third organic EL elements OLED3 are formed on the third insulating layer 1143.

That is, the pixel electrodes PE of the first organic EL elements OLED1 and the pixel electrodes PE of the second organic EL elements OLED2 are adjacent to each other in the X direction with one of the slits SL interposed therebetween. Similarly, the pixel electrodes PE of the second organic EL elements OLED2 and the pixel electrodes PE of the third organic EL elements OLED3 are adjacent to each other in the X direction with one of the slits SL interposed therebetween.

Figure 5:
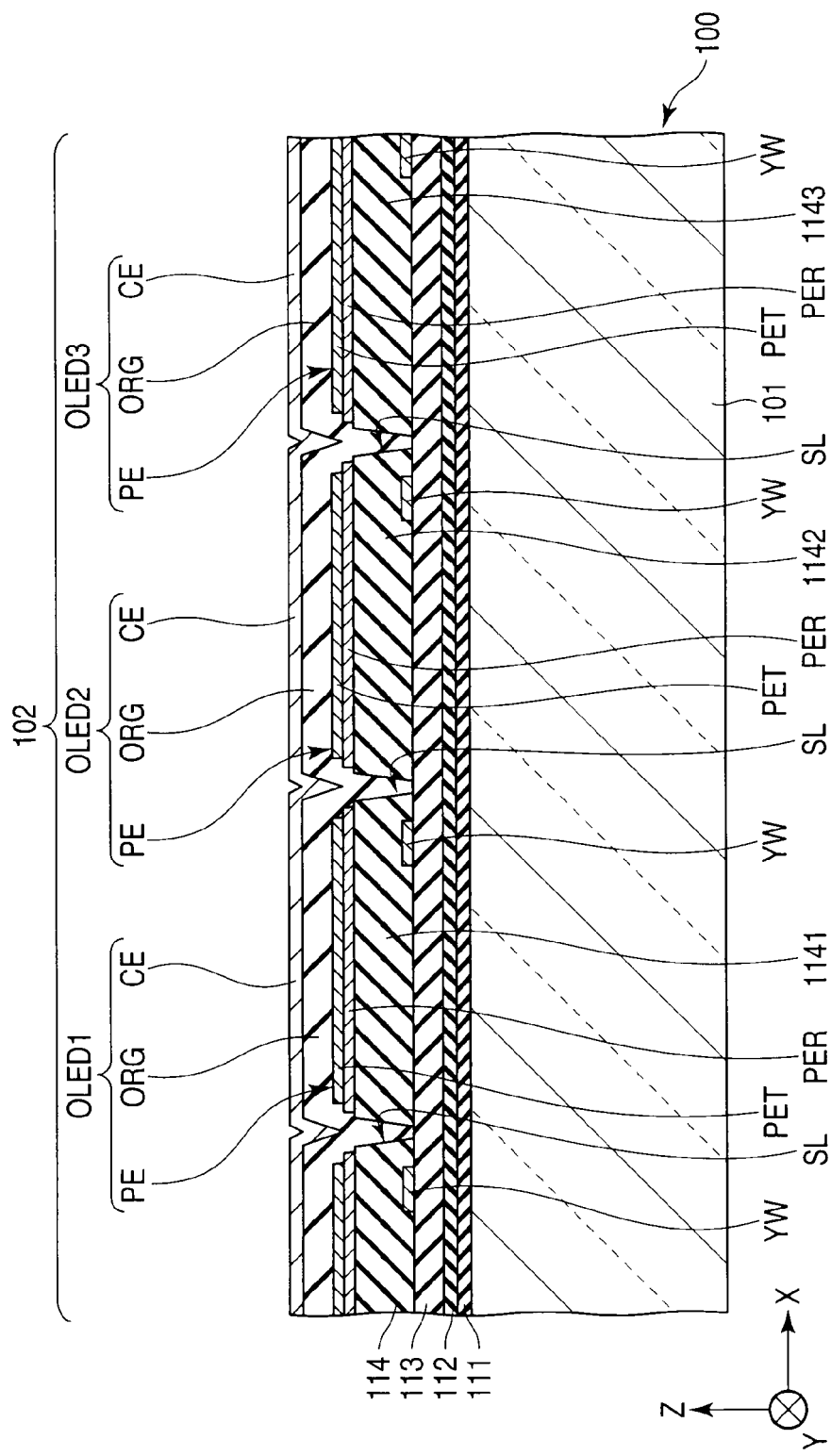
FIG. 5 is a sectional view taken along a line V-V of the array substrate shown in FIG. 4.

FIG. 5 is a sectional view taken along a line V-V of the array substrate shown in FIG. 4. In FIG. 5, the protective layer 150 is not shown.

On the insulating substrate 101, the undercoat layer 111, the gate insulator 112 and the first interlayer insulator 113 are stacked in this order. The lines YW are arranged on the first interlayer insulator 113. The wiring layer of the lines YW further includes the source electrodes S and the drain electrodes D. That is, the lines YW, the source electrodes S and the drain electrodes D are made of the same material.

In the present example, the lines YW are arranged such that one line YW is positioned below each of the organic EL elements OLED1 to OLED3. The lines YW may be arranged such that two or more lines Y are positioned below each of the organic EL elements OLED1 to OLED3.

The second interlayer insulator 114 is formed on the first interlayer insulator 113 and covers the entire lines YW. In FIG. 5, each of the insulating layers 1141 to 1143 covers the line YW.

The insulating layers 1141 and 1142 are spaced apart from each other with one of the slits SL interposed therebetween. The insulating layers 1142 and 1143 are spaced apart from each other with another slit SL interposed therebetween. Further, the lines YW are spaced apart from the slits SL.

The reflective layers PER of the pixel electrodes PE are formed on the upper surfaces of the insulating layers 1141 to 1143. The transmitting layers PET are formed on the reflecting layers PER. The organic layer ORG includes the regions formed on the pixel electrodes PE and the regions positioned in the slits SL. The organic layer is in contact with the first interlayer insulator 113 at positions of the slits SL. The counter electrode CE is formed on the organic layer ORG.

Figure 6:
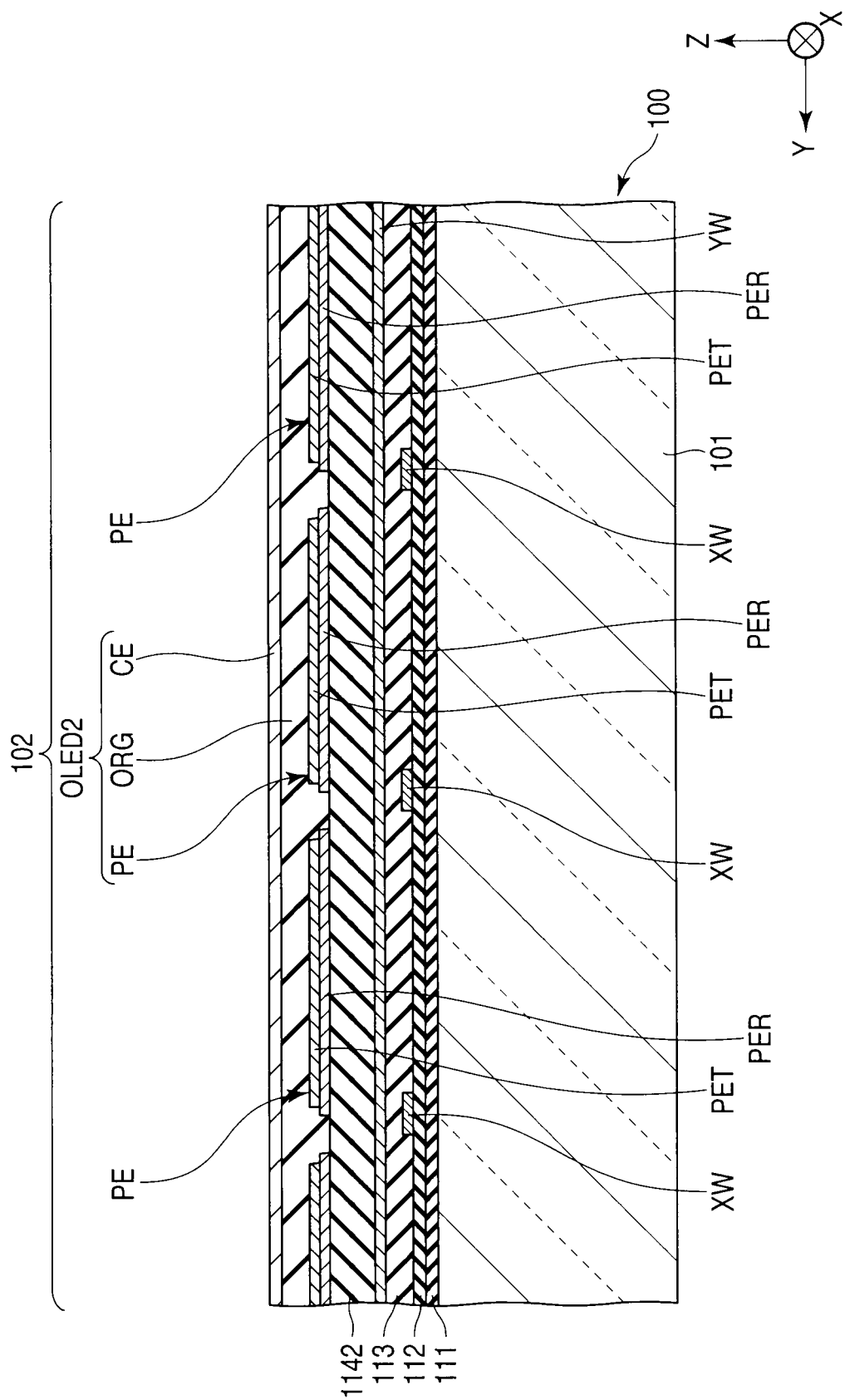
FIG. 6 is a sectional view taken along a line VI-VI of the array substrate shown in FIG. 4.

FIG. 6 is a sectional view taken along a line VI-VI of the array substrate shown in FIG. 4. In FIG. 6, the protective layer 150 is not shown.

On the insulating substrate 101, the undercoat layer 111 and the gate insulator 112 are stacked in this order. The lines XW are arranged on the gate insulator 112. The wiring layer of the lines XW further includes the gate electrodes G. That is, the lines XW and the gate electrodes G are made of the same material.

The first interlayer insulator 113 is formed on the gate insulator 112 and covers the entire lines XW.

The lines YW are arranged on the first interlayer insulator 113. The second interlayer insulator 114 is formed on the first interlayer insulator 113 and covers the entire lines YW. In FIG. 6, only the second insulating layer 1142 is shown as a part of the second interlayer insulator 114. The second insulating layer 1142 extends in the Y direction with no discontinuity in the active area 102. Similarly, the first insulating layer 1141 and the third insulating layer 1143 extend in the Y direction with no discontinuity in the active area 102, although not shown in FIG. 6.

The reflecting layers PER of the pixel electrodes PE are arranged on the upper surface of the second insulating layer 1142. The transmitting layers PET are formed on the reflecting layers PER, respectively. The organic layer ORG includes the regions formed on the pixel electrodes PE and the regions in contact with the second insulating layer 1142 between the pixel electrodes PE. The counter electrode CE is formed on the organic layer ORG.

In order to form the emitting layers EML1 to EML3 in patterns corresponding to the arrangements of the organic EL elements OLED1 to OLED3, respectively, a metal fine mask need be used for evaporation of the emitting materials. In this case, a partition for supporting the fine mask and preventing color mixture is required. In contrast, in the display panel 1, the different luminous colors of the organic EL elements OLED1 to OLED3 are achieved by the emitting layers EML1 to EML3 each extending over the organic EL elements OLED1 to OLED3. Such emitting layers EML1 to EML3 can be formed without a fine mask. Therefore, this display does not need the partition. As described above, the production process can be simplified by employing the structure described for the display panel 1.

In the display panel including the partition, the peripheries of the pixel electrodes PE are normally covered by the partition. That is, in such a display panel, only regions corresponding to central portions of the pixel electrodes PE contribute to light emission. In contrast, in the display panel 1, the organic layer ORG almost completely covers pixel electrodes PE, and the counter electrode CD covers almost the entire organic layer ORG. Therefore, approximately the whole regions corresponding to the pixel electrodes PE contribute to light emission. Thus, in the case where the aforementioned structure is employed in the display panel 1, it is possible to broaden the area contributing to light emission, that is, to increase the aperture ratio as compared with the case where the partition is used.

There is a possibility that defects of the counter electrode CE will occur. In the display panel in which a partition made of a resin material is formed in a reticular pattern or stripe pattern, when moisture enters into a part of the partition through such defects, moisture can spread to other portions of the partition. Thus, the organic EL element can be deteriorated over a broad region.

In contrast, the partition for separating the organic EL elements OLED1 to OLED3 from one another is omitted in the aforementioned display panel 1. Therefore, the spread of moisture via the partition cannot occur in this display panel 1. Thus, the display panel 1 is hard to cause deterioration of the organic EL elements OELD1 to OLED3 that occurs due to the spread of moisture.

Further, in this display panel 1, the second interlayer insulator 114 is provided with the slits SL each extending in the Y direction and arranged in the X direction. Thus, even when moisture enters into a part of the second interlayer insulator 114, the slits SL hinder the spread of the moisture in the X direction. Therefore, in the case where the aforementioned structure is employed, the deterioration of the organic EL elements OELD1 to OLED3 due to the spread of moisture is less prone to occur as compared with the case where the slits SL are omitted.

In this display panel 1, the lines YW are spaced apart from the slits SL and covered by the second interlayer insulator 114. Therefore, even when defects of the organic layer ORG occur at positions of the slits SL, a short circuit between the counter electrode CE and the line YW cannot occur.

Next, the second embodiment will be described.

Figure 9:
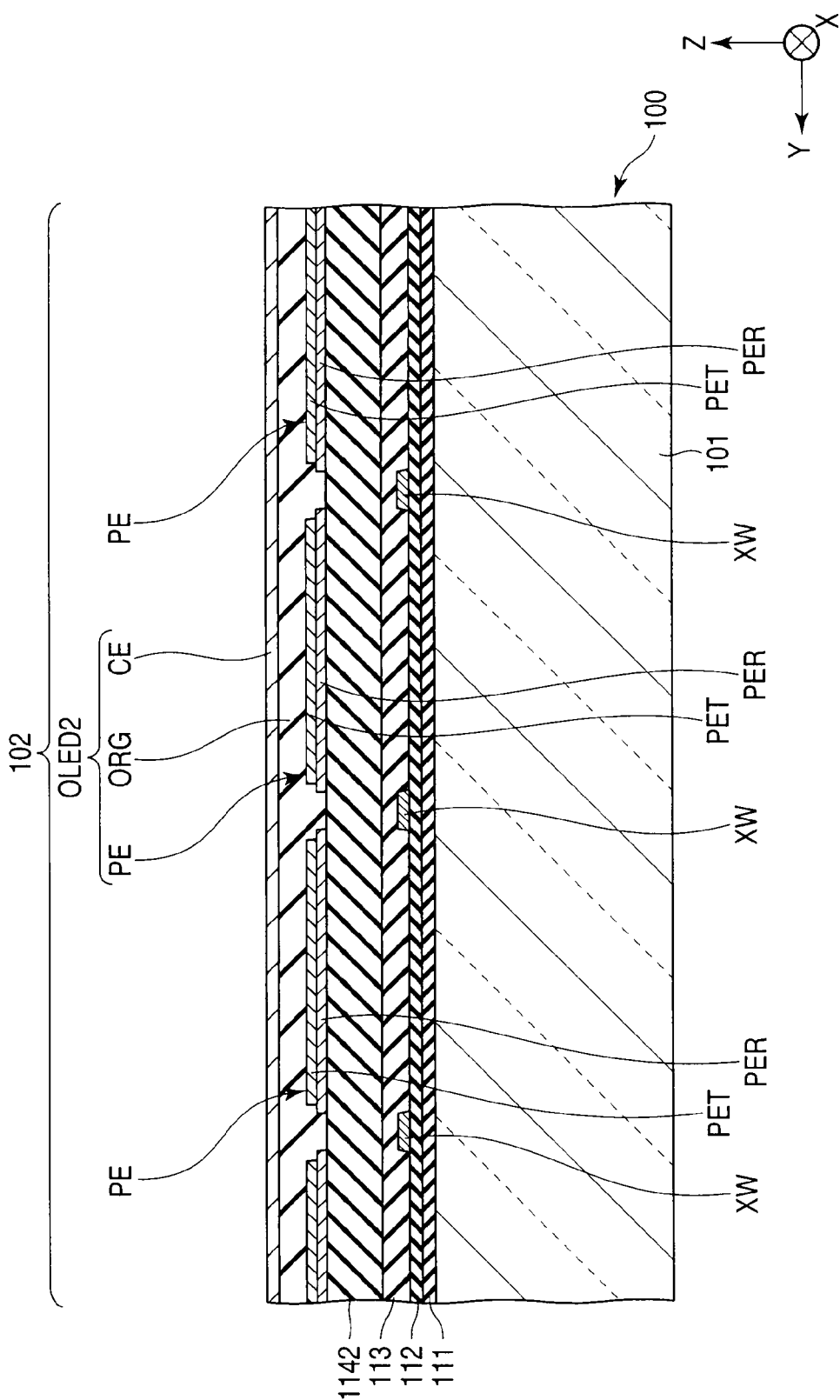
FIG. 9 is a sectional view taken along a line IX-IX of the array substrate shown in FIG. 7.

FIG. 7 is a plan view schematically showing an array substrate included in a display panel of an organic EL display according to the second embodiment. FIG. 8 is a sectional view taken along a line VIII-VIII of the array substrate shown in FIG. 7. FIG. 9 is a sectional view taken along a line IX-IX of the array substrate shown in FIG. 7.

Note that the switching elements SW are not shown in FIG. 7, while the protective layer 150 is not shown in FIGS. 8 and 9. In FIG. 8, the reference characters YW1 to YW3 indicate three of the lines YW shown in FIG. 7.

The structure shown in FIGS. 7 to 9 is the same as that described with reference to FIGS. 1 to 6 except that the lines YW are arranged at positions of the slits SL. That is, at least one of the lines YW includes a pair of edge portions and a center portion sandwiched between the edge portions. The center portion of each line YW is in contact with the organic layer ORG. The second interlayer insulator 114 covers the edge portions without covering the center portion.

Here, one line YW is positioned below each of the organic EL elements OLED1 to OLED3. In the case where two or more lines YW are arranged below each of the organic EL elements OLED1 to OLED3, the lines YW are arranged such that some of the lines YW are arranged at positions of the slits and the remainders of the lines YW are arranged below the second interlayer insulator 114 to space apart the slits SL.

In the case where this structure is employed, the same effect as that obtained when the structure described in the first embodiment is employed can be obtained, too. For example, the deterioration of the organic EL elements OELD1 to OLED3 due to moisture can be suppressed.

In the case where at least one of the edge portions of the line YW is not covered by the second interlayer insulator 114, the line YW produces a step on the bottom of the groove that the slit SL forms. Such a step may cause defects in the organic layer ORG. That is, in the case where at least one of the edge portions of the line YW is not covered by the second interlayer insulator 114, a short circuit between the line YW and the counter electrode CE is prone to occur.

In the structure described with reference to FIGS. 7 to 9, both edge portions of each line YW are covered by the second interlayer insulator 114. Thus, in this structure, the bottoms of the grooves that the slits SL form are substantially flat. Therefore, in the case of employing this structure, the short circuit between the line YW and the counter electrode CE is less prone to occur in spite of the fact that the lines YW are arranged at positions of the slits SL.

In the first and second embodiments, the slits SL are provided such that they divide the second interlayer insulator 114 at positions each corresponding to the gap between two of the organic EL elements OLED1 to OLED3 arranged in the X direction. Instead, the slits SL may be provided such that they divide the second interlayer insulator 11 at positions each corresponding to the gap between two of the organic EL elements OLED1 to OLED3 arranged in the Y direction.

Next, the third embodiment will be described.

Figure 12:
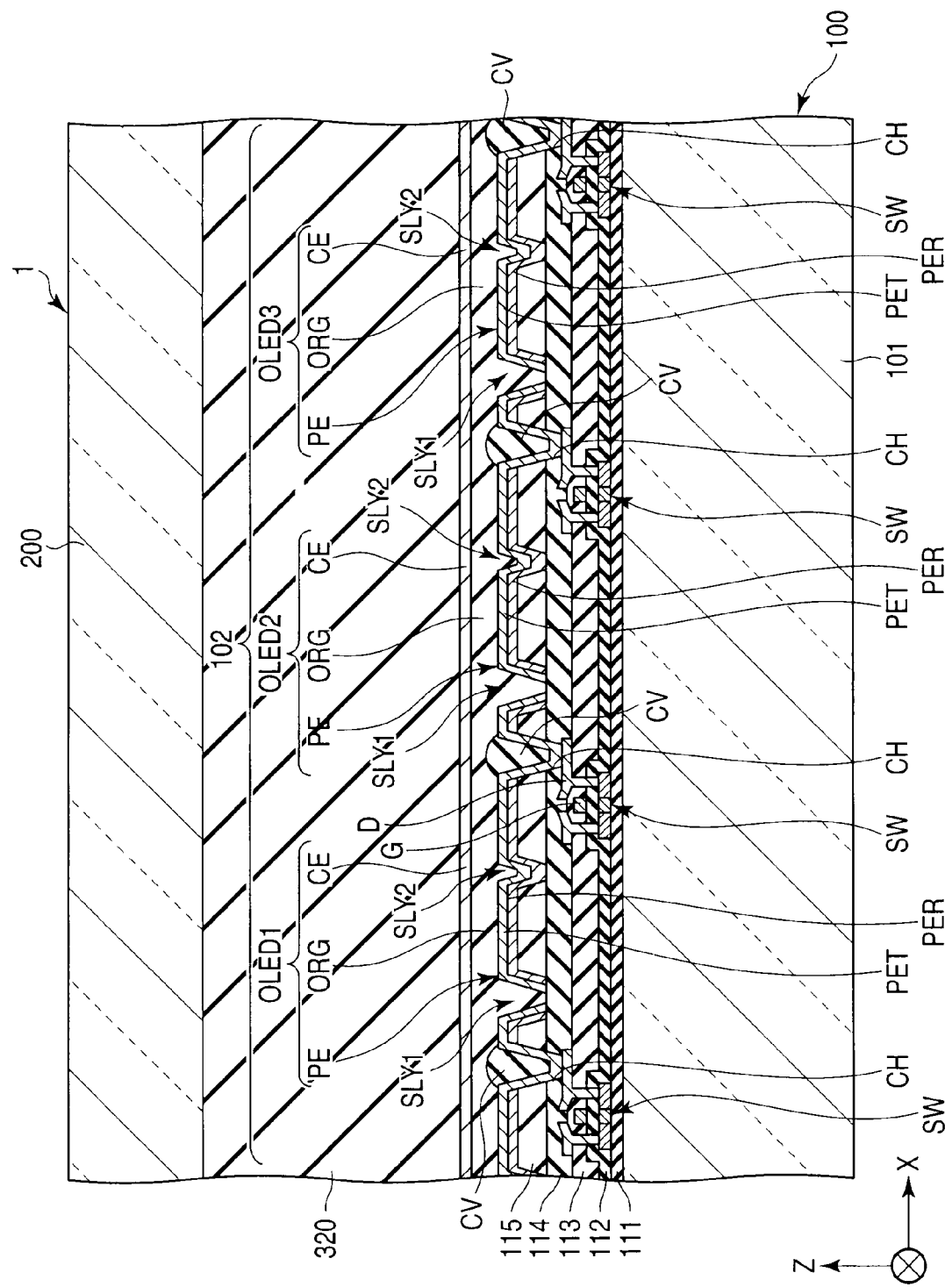
FIG. 12 is a cross sectional view schematically showing an example of a display panel including the array substrate shown in FIG. 10.

FIG. 10 is a plan view schematically showing an array substrate included in a display panel of an organic EL display according to the third embodiment. FIG. 11 is a plan view schematically showing slits provided to the second interlayer insulator of the array substrate shown in FIG. 10. FIG. 12 is a cross sectional view schematically showing an example of a display panel including the array substrate shown in FIG. 10. In FIG. 11, depicted is a structure of the array substrate shown in FIG. 10 from which the pixel electrodes PE and the elements disposed above the pixel electrodes PE are omitted. The cross section shown in FIG. 12 includes the cross section of the array substrate taken along a line XII-XII shown in FIG. 11.

The display panel 1 shown in FIG. 10 is almost the same as the display panel 1 described with reference to FIGS. 1 to 6 except that the array substrate 100 employs the following structure.

In the array substrate 100 shown in FIGS. 10 to 12, the second interlayer insulator 114 is provided with slits in a grid pattern. Specifically, the second interlayer insulator 114 is provided with the slits SLX1, SLY1 and SLY2 instead of the slits SL.

The slits SLX1 extend in the X direction and are arranged in the Y direction as shown in FIGS. 10 and 11. The slits SLX1 divide the second interlayer insulator 114 at positions each corresponding to the gap between two of the organic EL elements OLED1 to OLED3 arranged in the Y direction as shown in FIG. 10.

The slits SLY1 extend in the Y direction and are arranged in the X direction as shown in FIGS. 10 to 12. The slits SLY1 divide the second interlayer insulator 114 at positions each corresponding to the gap between two of the organic EL elements OLED1 to OLED3 arranged in the X direction as shown in FIGS. 10 and 12.

The slits SLY2 extend in the Y direction and are arranged in the X direction as shown in FIGS. 10 and 12. The slits SLY2 divide the portions of the second interlayer insulator 114 that correspond to the pixel electrodes PE as shown in FIGS. 10 and 12.

As above, the slits SLX1, SLY1 and SLY2 divide the second interlayer insulator 114 into insulating portions arranged in the X and Y directions. Each pixel electrode E covers the top and edge faces of two insulating portions. Such a structure suppresses permeation of moisture into the insulating portions.

This array substrate further includes cover members CV. The cover members CV are arranged below the organic layer ORG and cover the contact portions of the pixel electrodes PE. The cover members CV fill the recesses that the pixel electrodes form in the contact holes CH.

The cover members CV are arranged in an islands pattern correspondingly with the arrangement of the pixel electrodes PE. The cover members CV may further cover the portions of the pixel electrodes other than the contact portions. For example, the cover members CV may further cover the entire portions of the pixel electrodes PE that are positioned inside at least one of the slits SLX1, SLY1 and SLY2.

The cover members CV are made of an insulating material. The insulating material is, for example, an inorganic compound such as silicon nitride. As the material of the cover members CV, an insulating organic material such as resin can be used. Such cover members CV can be formed by, for example, photolithography or inkjet printing. It should be noted that in the case of using an organic material as the material of the cover members CV, the cover members CV are typically formed in an islands pattern.

As described above, in the display panel 1, the slits SLX1 and SLY1 divide the second interlayer insulator 114 at positions each corresponding to the gap between two of the organic EL elements OLED1 to OLED3. Thus, even when moisture enters into the second interlayer insulator 114, the slits SLX1 hinder the spread of the moisture in the Y direction and the slits SLY1 hinder the spread of the moisture in the X direction. Therefore, in the case of employing the above-described structure, the deterioration of the organic EL elements OELD1 to OLED3 due to the spread of moisture is less prone to occur as compared with the case where the slits SLX1 or SLY1 are omitted.

Further, in this display panel 1, the slits SLY2 divide the portions of the second interlayer insulator 114 that correspond to the organic EL elements OLED1 to OLED3. In the case of employing this structure, the deterioration of the organic EL elements OELD1 to OLED3 due to the spread of moisture is less prone to occur as compared with the case where the slits SLY2 are omitted. In addition, in the case of employing the above-described structure, when moisture enters into a portion of the second interlayer insulator 114 that corresponds to one of the organic EL elements OLED1 to OLED3, the slit SLY2 suppresses that the particular organic EL element is entirely deteriorated.

The second interlayer insulator 114 may be provided with the slits SLY2 such that only one slit SLY2 is positioned below each of the organic EL elements OLED1 to OLED3. Alternatively, the second interlayer insulator 114 may be provided with the slits SLY2 such that two or more slits SLY2 are positioned below each of the organic EL elements OLED1 to OLED3.

The slits SLX1 may be omitted from the display panel 1. Alternatively, the slit SLY2 may be omitted from the display panel 1.

Next, the fourth embodiment will be described.

FIG. 13 is a plan view schematically showing an array substrate included in a display panel of an organic EL display according to the fourth embodiment.

This array substrate is the same as the array substrate 100 described with reference to FIGS. 10 to 12 except that the second interlayer insulator 114 is provided with slits SLXY instead of the slits SLY2.

The slits SLXY extend in a direction that is inclined with respect to the X and Y directions and are arranged in the width direction thereof. The slits SLXY divide the portions of the second interlayer insulator 114 that correspond to the pixel electrodes PE.

As above, the slits that divide the portions of the second interlayer insulator 114 corresponding to the pixel electrodes PE may have length directions inclined with respect to the X and Y directions.

The second interlayer insulator 114 may be provided with the slits SLXY such that only one slit SLXY is positioned below each of the organic EL elements OLED1 to OLED3. Alternatively, the second interlayer insulator 114 may be provided with the slits SLXY such that two or more slits SLXY are positioned below each of the organic EL elements OLED1 to OLED3.

The slits SLX1 or SLY1 may be omitted from the array substrate.

Next, the fifth embodiment will be described.

Figure 14:
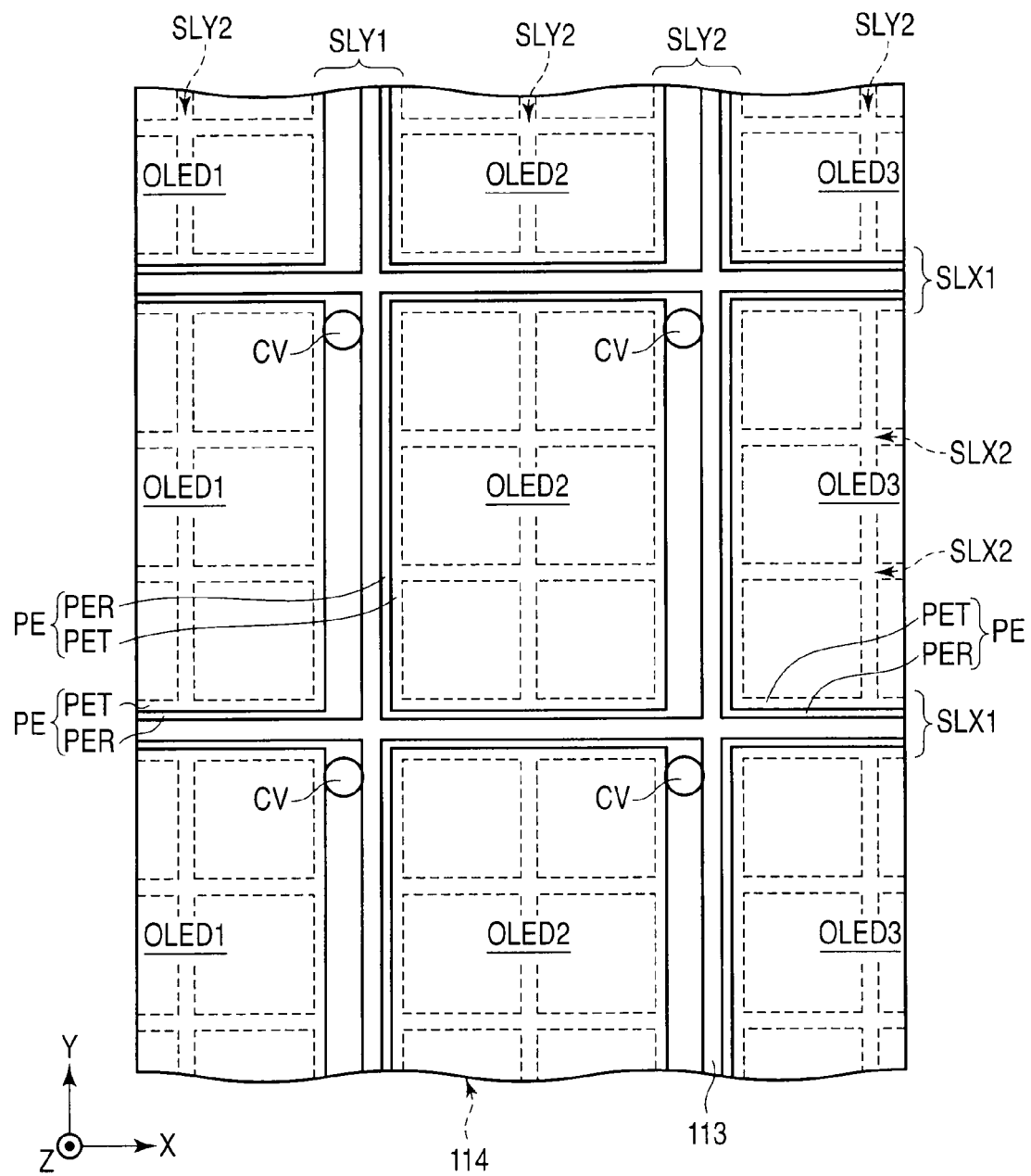
FIG. 14 is a plan view schematically showing an array substrate included in a display panel of an organic EL display according to the fifth embodiment.

FIG. 14 is a plan view schematically showing an array substrate included in a display panel of an organic EL display according to the fifth embodiment.

This array substrate is the same as the array substrate 100 described with reference to FIGS. 10 to 12 except that the second interlayer insulator 114 is further provided with slits SLX2.

The slits SLX2 extend in the X direction and are arranged in the Y direction. The slits SLX2 divide the portions of the second interlayer insulator 114 that correspond to the pixel electrodes PE.

In the case of employing the above-described structure, the deterioration of the organic EL elements OELD1 to OLED3 due to the spread of moisture is less prone to occur as compared with the case where the slits SLX2 are omitted. Further, in the case of employing the above-described structure, when moisture enters into a portion of the second interlayer insulator 114 that corresponds to one of the organic EL elements OLED1 to OLED3, the slit SXY2 suppresses that the particular organic EL element is entirely deteriorated.

The second interlayer insulator 114 may be provided with the slits SLX2 such that only one slit SLX2 is positioned below each of the organic EL elements OLED1 to OLED3. Alternatively, the second interlayer insulator 114 may be provided with the slits SLX2 such that two or more slits SLX2 are positioned below each of the organic EL elements OLED1 to OLED3.

The slits SLX1 or SLY1 may be omitted from the array substrate. The slits SLY2 may be omitted from the array substrate.

Next, the sixth embodiment will be described.

FIG. 15 is a plan view schematically showing an array substrate included in a display panel of an organic EL display according to the sixth embodiment.

This array substrate is the same as the array substrate 100 described with reference to FIGS. 10 to 12 except that the following structure is employed.

The second interlayer insulator 114 is provided with the slits SLX1, SLX2 and SLY1.

The slits SLX1 extend in the X direction and are arranged in the Y direction as in the array substrate 100 described with reference to FIGS. 10 to 12. The slits SLX1 divide the second interlayer insulator 114 at positions each corresponding to the gap between two of the organic EL elements OLED1 to OLED3 arranged in the Y direction.

The slits SLX2 extend in the X direction and are arranged in the Y direction as in the array substrate described with reference to FIG. 14. The slits SLX2 divide the portions of the second interlayer insulator 114 that correspond to the pixel electrodes PE.

The slits SLY1 extend in the Y direction and are arranged in the X direction as in the array substrate 100 described with reference to FIGS. 10 to 12. Unlike the slits SLY1 in the array substrate 10 described with reference to FIGS. 10 to 12, the slits SLY1 shown in FIG. 15 divide the second interlayer insulator 114 at positions each corresponding to a gap between two element groups arranged in the X direction and each including three organic EL elements OLED1 to OLED3 arranged in the X direction.

As above, the second interlayer insulator 114 may be provided with the slits SLY1 such that the slits SLY1 divide the second interlayer insulator 114 at positions each corresponding to a gap between two element groups arranged in the X direction and each including two or more organic EL elements arranged in the X direction.

The slits SLX1 and/or SLX2 may be omitted from the array substrate. The second interlayer insulator 114 of the array substrate may be provided with the slits SLY2 and/or SLXY instead of or in addition to the slits SLX2.

Next, the seventh embodiment will be described.

FIG. 16 is a plan view schematically showing an array substrate included in a display panel of an organic EL display according to the seventh embodiment.

This array substrate is the same as the array substrate 100 described with reference to FIGS. 10 to 12 except that the following structure is employed.

The second interlayer insulator 114 is provided with the slits SLX1, SLY1 and SLY2.

The slits SLX1 extend in the X direction and are arranged in the Y direction as in the array substrate 100 described with reference to FIGS. 10 to 12. Unlike the slits SLX1 of the array substrate 100 described with reference to FIGS. 10 to 12, the slits SLX1 shown in FIG. 16 divide the second interlayer insulator 114 at positions each corresponding to a gap between two element groups arranged in the Y direction and each including two organic EL elements arranged in the Y direction.

The slits SLY1 extend in the Y direction and are arranged in the X direction as in the array substrate 100 described with reference to FIGS. 10 to 12. The slits SLY1 divide the second interlayer insulator 114 at positions each corresponding to the gap between two of the organic EL elements OLED1 to OLED3 arranged in the X direction.

The slits SLY2 extend in the Y direction and are arranged in the X direction as in the array substrate described with reference to FIGS. 10 to 12. The slits SLY2 divide the portions of the second interlayer insulator 114 that correspond to the pixel electrodes PE.

As above, the second interlayer insulator 114 may be provided with the slits SLX1 such that the slits SLX1 divide the second interlayer insulator 114 at positions each corresponding to a gap between two element groups arranged in the Y direction and each including two or more organic EL elements arranged in the Y direction.

The slits SLY1 and/or SLY2 may be omitted from the array substrate. The second interlayer insulator 114 of the array substrate may be provided with the slits SLX2 and/or SLXY instead of or in addition to the slits SLY2.

Some examples will be described below.

<Manufacture of Display Panels DP1>

24 display panels 1 with 3.5-inch diagonal screen size were manufactured to have almost the same structure as that described with reference to FIGS. 10 to 12.

Specifically, insulating layers, wiring layers and organic EL elements were formed on a glass substrate with a size of 400 mm×500 mm to produce a first structure corresponding to 24 array substrates 100. Here, the organic layer ORG was formed by the following method. First, the hoe-transporting layer HTL and the emitting layer EML1 emitting red light described with reference to FIG. 3 were formed on the pixel electrodes PE using a vacuum evaporator including an electrical resistance heater. The portions of the emitting layer EML1 corresponding to the organic EL elements OLED2 and OLED3 were irradiated with ultraviolet rays with a predominant wavelength of 365 nm through a photomask. Subsequently, the emitting layer EML2 emitting green light was formed on the emitting layer EML1 using a vacuum evaporator including an electrical resistance heater. The portions of the emitting layer EML2 corresponding to the organic EL elements OLED3 were irradiated with ultraviolet rays with a predominant wavelength of 365 nm through a photomask. Then, the emitting layer EML3 emitting blue light, the electron-transporting layer ETL, the electron injection layer EIL and the counter electrode CE were formed on the emitting layer EML2 using a vacuum evaporator including an electrical resistance heater. MgAg was used as the material of the counter electrode CE. The layers included in the organic layer ORG and the counter electrode CE were formed as continuous film extending over the active area 102.

As a second structure corresponding to 24 counter substrates 200, a glass substrate having almost the same size as that for the first structure was prepared. The glass substrate was provided with 24 rectangular recesses on one main surface thereof.

A frame-shaped adhesive layer of an ultraviolet-curing resin was formed on the main surface of the second structure such that the adhesive layer surrounded the recesses. Then, the first and second structures were put one on top of the other such that the organic EL elements OLED1 to OLED3 faced the recesses. In this state, the adhesive layer was irradiated with ultraviolet rays using a photomask that shielded the active area 102 from the ultraviolet irradiation.

Then, the structure thus obtained was broken into 24 display panels 1. Driving circuits, etc. were mounted on the display panels 1. Hereinafter, the display panels 1 are referred to as "display panel DP1".

<Manufacture of Display Panels DP2>

24 display panels 1 were manufactured by the same method as that described for the display panels DP1 except that the structure described with reference to FIG. 14 was employed in the second interlayer insulator 114. Hereinafter, the display panels 1 are referred to as "display panel DP2".

<Manufacture of Display Panels DP3>

24 display panels 1 were manufactured by the same method as that described for the display panels DP1 except that the following structure was employed. Specifically, the slits SLY2 were omitted and thus only the slits SLX1 and SLY1 divided the second interlayer insulator 114 into insulating portions. In addition, the reflecting layers ER and the transmitting layers PET were formed such that they covered the upper surfaces of the insulating portions without covering the side faces the insulating portions. Hereinafter, the display panels 1 are referred to as "display panel DP3".

<Manufacture of Display Panels DP4>

24 display panels 1 were manufactured by the same method as that described for the display panels DP1 except that the following structure was employed. Specifically, the slits SLY2 were omitted and thus only the slits SLX1 and SLY1 divided the second interlayer insulator 114 into insulating portions. In addition, the reflecting layers ER and the transmitting layers PET were formed such that they covered the side faces the insulating portions in addition to the upper surfaces of the insulating portions. Hereinafter, the display panels 1 are referred to as "display panel DP4".

<Manufacture of Display Panels DP5>

24 display panels 1 were manufactured by the same method as that described for the display panels DP1 except that the slits SLX1, SLY1 and SLY2 and the cover members CV were omitted and a partition was provided between the second interlayer insulator 114 and the organic layer ORG. For forming the partition, a film of a photosensitive resin was formed first and then the film was subjected to photolithography. The partition was formed in a grid pattern corresponding to the gas among the pixel electrodes PE arranged in the X and Y direction such that the partition covered each periphery of the pixel electrodes PE. Hereinafter, the display panels 1 are referred to as "display panel DP5".

<Evaluation>

Each of the display panels D1 to DP5 was placed in the atmosphere with a relative humidity of 85% at a temperature of 85° C. for a predetermined period. Then, each panel was switched on and the number of dark spots was counted with the naked eye. The results are summarized in the TABLE 1 below.

TABLE 1

| Display panels | Slits | End faces of insulating portions covered by pixel electrodes | Number of insulating portions per pixel | Number of display panels in which dark spots were produced | | | | | | | | |
|---|---|---|---|---|---|---|---|---|---|---|---|---|
| | | | | 10 hr | 15 hr | 20 hr | 25 hr | 30 hr | 35 hr | 40 hr | 45 hr | 50 hr |
| DP1 | Grid pattern | Yes | 2 | 0 | 0 | 0 | 0 | 0 | 0 | 0 | 0 | 2 |
| DP2 | Grid pattern | Yes | 6 | 0 | 0 | 0 | 0 | 0 | 0 | 0 | 0 | 0 |
| DP3 | Grid pattern | Yes | 1 | 0 | 0 | 0 | 0 | 0 | 0 | 3 | 5 | 7 |
| DP4 | Grid pattern | No | 1 | 0 | 0 | 0 | 0 | 0 | 0 | 0 | 1 | 3 |
| DP5 | None | — | — | 0 | 0 | 7 | 23 | 24 | 24 | 24 | 24 | 24 |

As shown in TABLE 1, in the display panels in which no partition was present and the slits divided the second interlayer insulator 114 into the insulating portions, occurrence of the dark spots was suppressed as compared with the display including a partition. In the display panels in which the edge faces of the insulating portions were covered by the pixel electrodes PE, occurrence of the dark spots was suppressed as compared with the display in which the edge faces of the insulating portions were not covered by the pixel electrodes PE. In the display panels in which the second interlayer insulator 114 was divided at portions each corresponding to a gap between the pixel electrodes PE and at portions corresponding to the pixel electrodes PE, occurrence of the dark spots was suppressed as compared with the display in which the second interlayer insulator 114 was divided only at portions each corresponding to a gap between the pixel electrodes PE. Further, in the display panels in which the second interlayer insulator 114 was divided into a greater number of insulating portions, occurrence of the dark spots was suppressed as compared with the display in which the second interlayer insulator 114 was divided into a smaller number of insulating portions.

In the above, organic EL devices were illustrated with organic EL displays. The organic EL devices may be devices other than organic EL displays such as organic EL luminaries or organic EL printer heads.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic EL device comprising:
an insulating substrate;
a first interlayer insulator positioned above the insulating substrate;
a second interlayer insulator positioned on the first interlayer insulator and provided with slits;
pixel electrodes arranged on the second interlayer insulator, two or more of the pixel electrodes being adjacent to each other with a gap therebetween, the gap being positioned above one of the slits;
an organic layer including first regions covering the pixel electrodes and second regions positioned in the slits, the organic layer emitting light at positions corresponding to the pixel electrodes; and
a counter electrode positioned above the organic layer,
wherein the slits includes:
one or more first slits dividing the second interlayer insulator at a position corresponding to the gap between the pixel electrodes; and
one or more second slits dividing portions of the second interlayer insulator that corresponds to the pixel electrodes.

2. An organic EL device comprising:
an insulating substrate;
an interlayer insulator formed above the insulating substrate;
insulating portions formed above the interlayer insulator and spaced apart from each other;

thin-film transistors arranged between the insulating substrate and the insulating portions;

pixel electrodes formed on the insulating portions, the pixel electrodes being electrically connected to the thin-film transistors, respectively;

an organic layer including first regions formed above the pixel electrodes and second regions positioned between the insulating portions, the organic layer emitting light at positions corresponding to the pixel electrodes; and a counter electrode formed above the organic layer, wherein two or more of the insulating portions are positioned below one of the pixel electrodes.

3. An organic EL device comprising:

an insulating substrate;

a first interlayer insulator positioned above the insulating substrate;

a second interlayer insulator positioned on the first interlayer insulator and provided with slits;

pixel electrodes arranged on the second interlayer insulator, two or more of the pixel electrodes being adjacent to each other with a gap therebetween, the gap being positioned above one of the slits;

an organic layer positioned on the pixel electrodes and including an emitting layer; and a counter electrode positioned above the organic layer, wherein the slits include:

one or more first slits dividing the second interlayer insulator at a position corresponding to the gap between the pixel electrodes; and one or more second slits dividing portions of the second interlayer insulator that corresponds to the pixel electrodes.

4. An organic EL device comprising:

an insulating substrate;

an interlayer insulator formed above the insulating substrate;

insulating portions formed above the first interlayer insulator and spaced apart from each other;

thin-film transistors arranged between the insulating substrate and the insulating portions;

pixel electrodes formed on the insulating portions, the pixel electrodes being electrically connected to the thin-film transistors, respectively;

an organic layer formed above the pixel electrodes and including an emitting layer; and a counter electrode formed above the organic layer, wherein two or more of the insulating portions are positioned below one of the pixel electrodes.

* * * * *